(12) United States Patent
Kozicki

(10) Patent No.: US 8,218,350 B2
(45) Date of Patent: Jul. 10, 2012

(54) PROGRAMMABLE METALLIZATION CELL STRUCTURE INCLUDING AN INTEGRATED DIODE, DEVICE INCLUDING THE STRUCTURE, AND METHOD OF FORMING SAME

(75) Inventor: Michael N. Kozicki, Phoenix, AZ (US)

(73) Assignee: Axon Technologies Corporation, Scottsdale, AZ (US)

( * ) Notice: Subject to any disclaimer, the term of this patent is extended or adjusted under 35 U.S.C. 154(b) by 0 days.

(21) Appl. No.: 13/229,417

(22) Filed: Sep. 9, 2011

(65) Prior Publication Data

US 2011/0315947 A1 Dec. 29, 2011

Related U.S. Application Data

(60) Continuation-in-part of application No. 12/895,509, filed on Sep. 30, 2010, now Pat. No. 8,134,140, which is a continuation-in-part of application No. 12/475,271, filed on May 29, 2009, now Pat. No. 8,022,384, which is a continuation of application No. 12/136,629, filed on Jun. 10, 2008, now Pat. No. 7,560,722, which is a continuation of application No. 11/744,382, filed on May 4, 2007, now Pat. No. 7,385,219, which is a continuation-in-part of application No. 11/117,229, filed on Apr. 28, 2005, now Pat. No. 7,169,635, which is a division of application No. 10/390,268, filed on Mar. 17, 2003, now Pat. No. 6,927,411, which is a continuation-in-part of application No. 10/268,107, filed on Oct. 9, 2002, now Pat. No. 6,985,378, which is a continuation-in-part of application No. 10/118,276, filed on Apr. 8, 2002, now Pat. No. 6,825,489, which is a continuation-in-part of application No. 09/502,915, filed on Feb. 11, 2000, now Pat. No. 6,487,106, and a continuation-in-part of application No. 09/951,882, filed on Sep. 10, 2001, now Pat. No. 6,635,914.

(60) Provisional application No. 61/247,093, filed on Sep. 30, 2009.

(51) Int. Cl.
*G11C 11/00* (2006.01)

(52) U.S. Cl. ........ 365/148; 365/100; 365/113; 365/129; 365/151; 365/163; 257/296; 977/754

(58) Field of Classification Search ............... 365/46, 365/94, 100, 113, 129, 148, 151, 163; 257/2–5, 257/296, E31.047, E27.006; 438/29, 95, 438/96, 166, 259, 365, 482, 486, 597
See application file for complete search history.

(56) References Cited

U.S. PATENT DOCUMENTS

| | | | |
|---|---|---|---|
| 3,679,945 A | 7/1972 | Sekido et al. | |
| 3,715,634 A * | 2/1973 | Ovshinsky | 257/2 |
| 3,761,896 A | 9/1973 | Davidson | |
| 3,886,577 A * | 5/1975 | Buckley | 257/3 |
| 4,203,123 A | 5/1980 | Shanks | |
| 4,945,257 A | 7/1990 | Marrocco, III | |

(Continued)

*Primary Examiner* — Richard Elms
*Assistant Examiner* — Harry W Byrne
(74) *Attorney, Agent, or Firm* — Snell & Wilmer, LLP

(57) ABSTRACT

A microelectronic programmable structure suitable for storing information and array including the structure and methods of forming and programming the structure are disclosed. The programmable structure generally includes an ion conductor and a plurality of electrodes. Electrical properties of the structure may be altered by applying energy to the structure, and thus information may be stored using the structure.

20 Claims, 28 Drawing Sheets

U.S. PATENT DOCUMENTS

| | | |
|---|---|---|
| 5,153,681 A | 10/1992 | Kishimoto et al. |
| 5,278,636 A | 1/1994 | Williams |
| 5,761,110 A | 6/1998 | Irrinki et al. |
| 6,418,049 B1 * | 7/2002 | Kozicki et al. ............... 365/174 |
| 6,487,106 B1 * | 11/2002 | Kozicki ............... 365/153 |
| 6,635,914 B2 * | 10/2003 | Kozicki et al. ............... 257/296 |
| 6,998,312 B2 * | 2/2006 | Kozicki et al. ............... 438/270 |
| 7,405,967 B2 * | 7/2008 | Kozicki et al. ............... 365/174 |

* cited by examiner

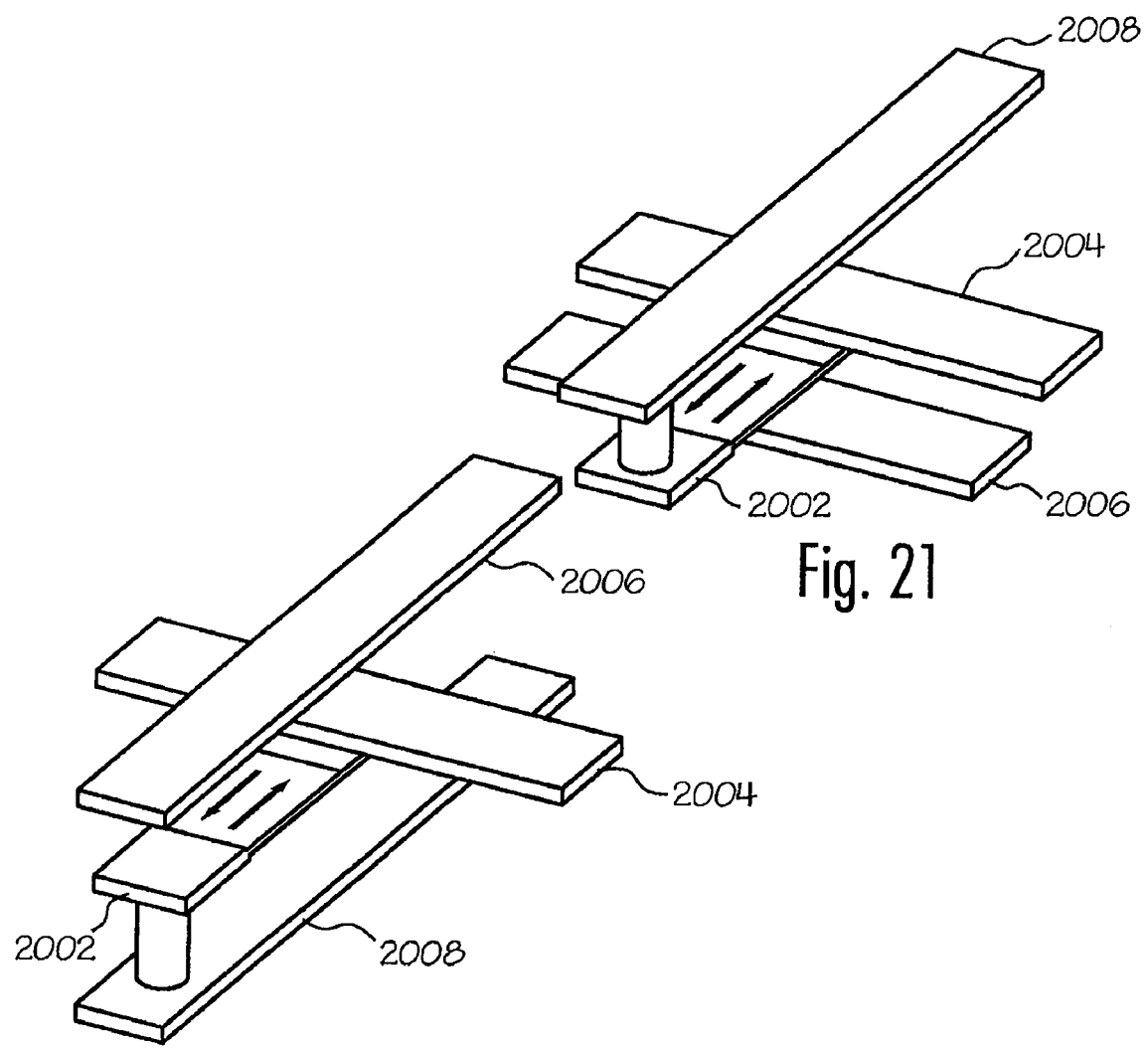

PROGRAMMABLE METALLIZATION CELL STRUCTURE INCLUDING AN INTEGRATED DIODE, DEVICE INCLUDING THE STRUCTURE, AND METHOD OF FORMING SAME

CROSS REFERENCE TO RELATED APPLICATIONS

This application is a continuation of application Ser. No. 12/895,509, entitled PROGRAMMABLE METALLIZATION CELL STRUCTURE INCLUDING AN INTEGRATED DIODE, DEVICE INCLUDING THE STRUCTURE, AND METHOD OF FORMING SAME, filed Sep. 30, 2010, which is a continuation-in-part of application Ser. No. 12/475,271, entitled OPTIMIZED SOLID ELECTROLYTE FOR PROGRAMMABLE METALLIZATION CELL DEVICES AND STRUCTURES, filed May 29, 2009, which is a continuation of application Ser. No. 12/136,629, entitled OPTIMIZED SOLID ELECTROLYTE FOR PROGRAMMABLE METALLIZATION CELL DEVICES AND STRUCTURES, filed Jun. 10, 2008, which is a continuation of application Ser. No. 11/744,382, entitled OPTIMIZED SOLID ELECTROLYTE FOR PROGRAMMABLE METALLIZATION CELL DEVICES AND STRUCTURES, filed May 4, 2007, which is a continuation-in-part of application Ser. No. 11/117,229, entitled PROGRAMMABLE STRUCTURE, AN ARRAY INCLUDING THE STRUCTURE, AND METHODS OF FORMING THE SAME, filed Aug. 28, 2005, which is a divisional of application Ser. No. 10/390,268, entitled PROGRAMMABLE STRUCTURE, AN ARRAY INCLUDING THE STRUCTURE, AND METHODS OF FORMING THE SAME, filed Mar. 17, 2003, which is a continuation-in-part of U.S. application Ser. No. 10/268,107, entitled PROGRAMMABLE MICROELECTRONIC DEVICE, STRUCTURE, AND SYSTEM AND METHOD OF FORMING THE SAME, filed Oct. 9, 2002, which is a continuation-in-part of application Ser. No. 10/118,276, entitled MICROELECTRONIC DEVICE, STRUCTURE, AND SYSTEM, INCLUDING A MEMORY STRUCTURE HAVING A VARIABLE PROGRAMMABLE PROPERTY AND METHOD OF FORMING SAME, filed Apr. 9, 2002, which is a continuation-in-part of application Ser. No. 09/502,915, entitled PROGRAMMABLE MICROELECTRONIC DEVICES AND METHODS OF FORMING AND PROGRAMMING SAME, filed Feb. 11, 2000; the '276 application is a continuation-in-part of application Ser. No. 09/951,882, entitled MICROELECTRONIC PROGRAMMABLE DEVICE AND METHODS OF FORMING AND PROGRAMMING THE SAME, filed Sep. 10, 2001; this application also claims the benefit of Provisional Application Ser. No. 61/247,093, entitled PROGRAMMABLE METALLIZATION CELL DEVICES WITH INTEGRATED DIODE, filed Sep. 30, 2009.

FIELD OF INVENTION

The present invention generally relates to microelectronic devices. More particularly, the invention relates to programmable metallization cell structures, to devices including the structures, and to methods of forming the structures and devices.

BACKGROUND OF THE INVENTION

Memory structures and devices are often used in electronic systems and computers to store information in the form of binary data and/or to program logic. These memory and logic devices may be characterized into various types, each type having associated with it various advantages and disadvantages.

For example, random access memory ("RAM") which may be found in personal computers is typically volatile semiconductor memory; in other words, the stored data is lost if the power source is disconnected or removed. Dynamic RAM ("DRAM") is particularly volatile in that it must be "refreshed" (i.e., recharged) every few microseconds in order to maintain the stored data. Static RAM ("SRAM") will hold the data after one writing so long as the power source is maintained; once the power source is disconnected, however, the data is lost. Thus, in these volatile memory configurations, information is only retained so long as the power to the system is not turned off. In general, these RAM devices can take up significant chip area and therefore may be expensive to manufacture and consume relatively large amounts of energy for data storage. Accordingly, improved memory devices suitable for use in personal computers and the like are desirable.

Other storage devices such as magnetic storage devices (e.g., hard disks and magnetic tape) as well as other systems, such as optical disks, CD-RW and DVD-RW are non-volatile, have extremely high capacity, and can be rewritten many times. Unfortunately, these memory devices are physically large, are shock/vibration-sensitive, require expensive mechanical drives, and may consume relatively large amounts of power. These negative aspects make such memory devices non-ideal for low power portable applications such as lap-top and palm-top computers, personal digital assistants ("PDAs"), and the like.

Yet additional forms of memory include programmable read-only memory ("PROM") devices. One type of PROM, a write-once read-many ("WORM") device, uses an array of fusible links. Once programmed, the WORM device cannot be reprogrammed.

Other forms of PROM devices include erasable PROM ("EPROM") and electrically erasable PROM (EEPROM) devices, which are alterable after an initial programming. EPROM devices generally require an erase step involving exposure to ultra violet light prior to programming the device. Thus, such devices are generally not well suited for use in portable electronic devices. EEPROM devices are generally easier to program, but suffer from other deficiencies. In particular, EEPROM devices are relatively complex, are relatively difficult to manufacture, and are relatively large. Furthermore, a circuit including EEPROM devices must withstand the high voltages necessary to program the device. Consequently, EEPROM cost per bit of memory capacity is extremely high compared with other means of data storage. Another disadvantage of EEPROM devices is that, although they can retain data without having the power source connected, they require relatively large amounts of power to program. This power drain can be considerable in a compact portable system powered by a battery.

Another type of memory device is a field programmable gate array (FPGA) device. FPGA devices include programmable logic blocks and (re)configurable interconnects that allow the logic blocks to be coupled together, such that the blocks can be programmed or configured to perform desired functions. The logic blocks typically include memory structures, which may be based on antifuse, SRAM, PROM, EPROM, EEPROM, Flash, Fuse, or similar technology. Since the memory structures of the FPGA devices are generally based on other technologies, the FPGA devices often exhibit similar advantages and disadvantages of the underlying memory technology.

In view of the various problems associated with conventional data storage and programmable devices described above, a relatively non-volatile, programmable structure that is relatively simple and inexpensive to produce is desired. Furthermore, this structure should meet the requirements of the new generation of portable computer devices by operating at a relatively low voltage while providing high storage density and a low manufacturing cost.

SUMMARY OF THE INVENTION

The present invention provides improved microelectronic programmable devices, structures, and systems and methods of forming the same. More particularly, the invention provides programmable structures that can be variably programmed depending on an amount of energy used to program the device. Such structures can replace both traditional nonvolatile and volatile forms of memory and logic devices and can be formed on the same substrate as and/or overlying another microelectronic device.

The ways in which the present invention addresses various drawbacks of now-known programmable devices are discussed in greater detail below. However, in general, the present invention provides a programmable structure that is relatively easy and inexpensive to manufacture, which is relatively easy to program, and which can be variably programmed.

In accordance with one exemplary embodiment of the present invention, a programmable structure includes an ion conductor and at least two electrodes. The structure is configured such that when a bias is applied across two electrodes, one or more electrical properties of the structure change. In accordance with one aspect of this embodiment, a resistance across the structure changes when a bias is applied across the electrodes. In accordance with other aspects of this embodiment, a capacitance or other electrical property of the structure changes upon application of a bias across the electrodes. In accordance with a further aspect of this embodiment, an amount of change in the programmable property is manipulated by altering (e.g., thermally or electrically) an amount of energy used to program the device. One or more of these electrical changes and/or the amount of change may suitably be detected. Thus, stored information may be retrieved from a circuit including the structure and/or logic may be programmed using the structure.

In accordance with another exemplary embodiment of the invention, a programmable structure includes an ion conductor, at least two electrodes, and a barrier interposed between at least a portion of one of the electrodes and the ion conductor. In accordance with one aspect of this embodiment, the barrier material includes a material configured to reduce diffusion of ions between the ion conductor and at least one electrode. In accordance with another aspect, the barrier material includes an insulating or high-resistance material. In accordance with yet another aspect of this embodiment, the barrier includes material that conducts ions, but which is relatively resistant to the conduction of electrons.

In accordance with another exemplary embodiment of the invention, a programmable microelectronic structure is formed on a surface or using a portion of a substrate by forming a first electrode on or within a portion of the substrate, depositing a layer of ion conductor material over the first electrode, and depositing conductive material onto the ion conductor material. In accordance with one aspect of this embodiment, a solid solution including the ion conductor and excess conductive material is formed by dissolving (e.g., via thermal and/or photodissolution) a portion of the conductive material in the ion conductor. In accordance with a further aspect, only a portion of the conductive material is dissolved, such that a portion of the conductive material remains on a surface of the ion conductor to form an electrode on a surface of the ion conductor material. In accordance with another aspect of this embodiment of the invention, a structure including a high-resistance region is formed by dissolving a portion of the electrode such that a portion of the ion conductor includes a high concentration of the electrode material and another portion of the ion conductor includes a low concentration of the electrode material, such that the portion of the ion conductor with a low concentration of the electrode material forms a high resistance region within the structure.

In accordance with another embodiment of the invention, a lateral programmable structure is formed by forming an ion conductor layer overlying a substrate and forming two or more electrode structures in contact with the ion conductor layer. In accordance with one aspect of this embodiment, the structure includes a conductive layer adjacent the ion conductor to facilitate rapid growth of a conductive region within or on the ion conductor.

In accordance with another embodiment of the invention, a programmable device may be formed on a surface of a substrate. In accordance with one aspect of this embodiment, the substrate includes a microelectronic circuit. In accordance with a further aspect of this embodiment, the programmable device is formed overlying the microelectronic circuit and conductive lines between the microelectronic circuit and the programmable device are formed using conductive wiring schemes within the substrate and the memory device. This configuration allows transmission of more bits of information per bus line.

In accordance with a further exemplary embodiment of the invention, multiple bits of information are stored in a single programmable structure. In accordance with one aspect of this embodiment, a programmable structure includes a floating electrode interposed between two additional electrodes.

In accordance with yet another embodiment of the invention, multiple programmable devices are coupled together using a common electrode (e.g., a common anode or a common cathode).

In accordance with yet a further exemplary embodiment of the present invention, a capacitance of a programmable structure is altered by causing ions within an ion conductor of the structure to migrate.

In accordance with yet another embodiment of the invention, a volatility of a memory cell in accordance with the present invention is manipulated by altering an amount of energy used during a write process for the memory. In accordance with this embodiment of the invention, higher energy is used to form nonvolatile memory, while lower energy is used to form volatile memory. Thus, a single memory device, formed on a single substrate, may include both nonvolatile and volatile portions. In accordance with a further aspect of this embodiment, the relative volatility of one or more portions of the memory may be altered at any time by changing an amount of energy supplied to a portion of the memory during a write process.

In accordance with additional embodiment of the invention, the structures include an additional conductive layer proximate one or more of the electrodes to improve the speed of the read/write process.

In accordance with yet another embodiment of the invention, pulse mode programming is used to read and write information. In this case, information can be retrieved from the device using a destructive read or a destructive write process.

In accordance with yet another embodiment of the invention, a programmable structure includes an additional electrode for sensing a state (o or 1) of the programmable device.

In accordance with further exemplary embodiments of the invention, a programmable structure includes an integrated diode. The diode can facilitate isolation of one structure in an "on" state from other programmable structures. And, because the diode is integrated with the programmable structure, the diode does not require any additional silicon space, such that devices can be manufactured with $4F^2$ cell geometry. In accordance with various aspects of these embodiments, a diode is formed between an electrode and conductive material within the ion conductor. In accordance with further aspects, a diode is formed between a barrier layer and conductive material within the ion conductor. In accordance with further aspects, a diode is formed between a semiconductor material and conductive material within the ion conductor. In these cases, a reverse-bias breakdown of the diode can be manipulated by adjusting an amount of doping in the semiconductor material. By way of examples, low doping in the semiconductor material (e.g., less than $10^{16}/cm^3$) leads to diodes with very high breakdown voltages (e.g., greater than 10, 50, or 100 V), such that the isolation is high, but the devices are difficult to erase. These devices may be suitable for WORM and the like applications. In contrast, higher doping in the semiconductor material creates structures with lower reverse bias breakdown, so that the structures may be erased while still providing adequate isolation between structures.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

FIGS. 20-24 are illustrations of programmable structures having an additional electrode for sensing a state of the structures;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

The present invention generally relates to programmable microelectronic structures, to devices and arrays including the structures, and to methods of forming the structures, devices, and arrays.

Figure 1:
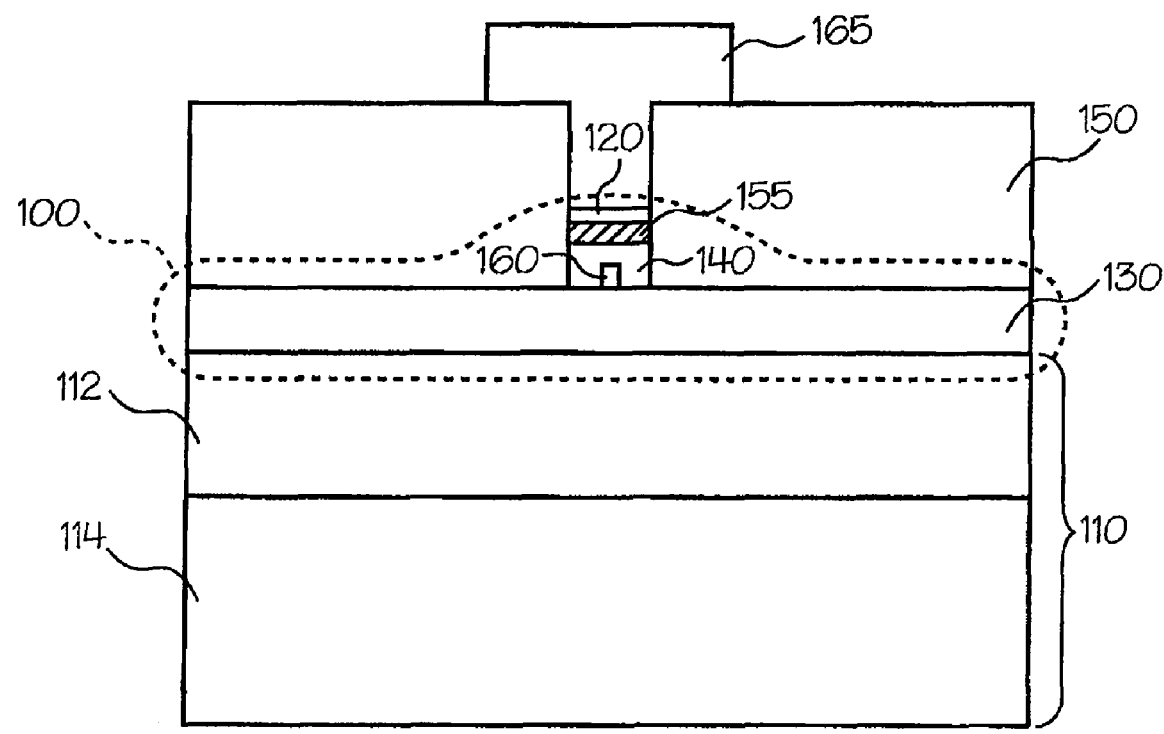
FIGS. 1 and 2 are cross-sectional illustrations of a programmable structure formed on a surface of a substrate in accordance with exemplary embodiments of the present invention.
Figure 2:
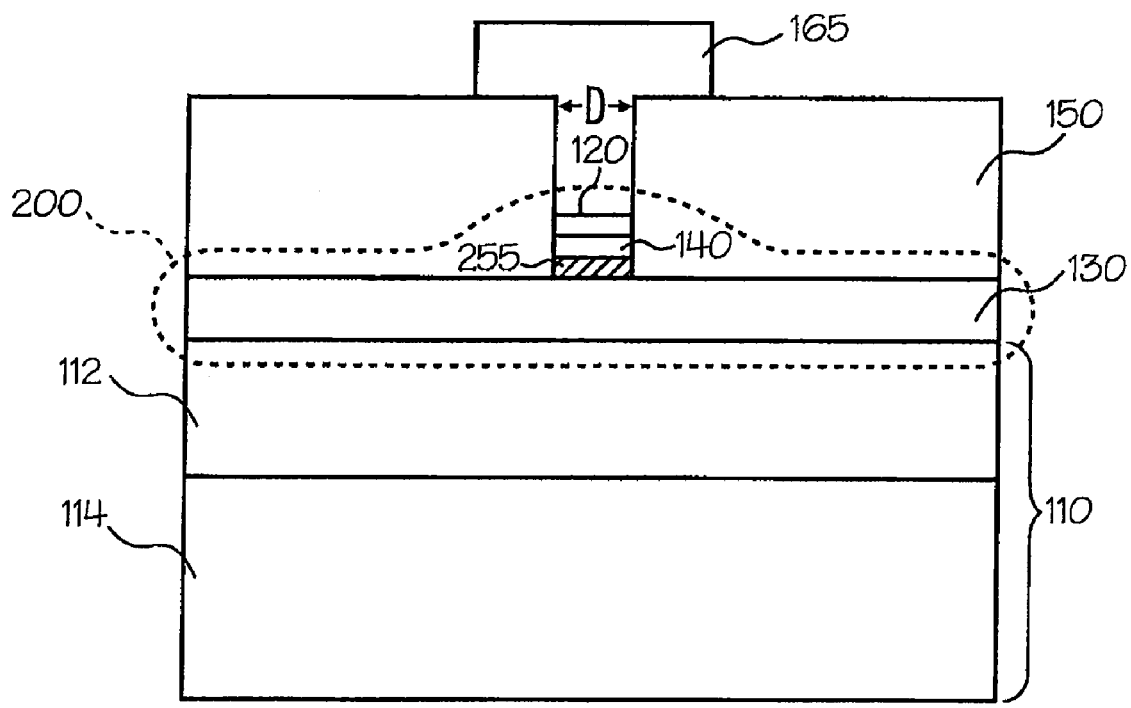

FIGS. 1 and 2 illustrate programmable microelectronic structures 100 and 200 formed on a surface of a substrate 110 in accordance with an exemplary embodiment of the present invention. Structures 100 and 200 include electrodes 120 and 130, an ion conductor 140, and optionally include buffer or barrier layers or regions 155 and/or 255.

Generally, structures 100 and 200 are configured such that when a bias greater than a threshold voltage ($V_T$), discussed in more detail below, is applied across electrodes 120 and 130, the electrical properties of structure 100 change. For example, in accordance with one embodiment of the invention, as a voltage $V \geq V_T$ is applied across electrodes 120 and 130, conductive ions within ion conductor 140 begin to migrate and form a region 160 (e.g., an electrodeposit) having an increased conductivity compared to the bulk ion conductor at or near the more negative of electrodes 120 and 130. As region 160 forms, the resistance between electrodes 120 and 130 decreases, and other electrical properties may also change.

In the absence of any barriers, which are discussed in more detail below, the threshold voltage required to grow region 160 from one electrode toward the other and thereby significantly reduce the resistance of the device is approximately a few hundred millivolts. If the same voltage is applied in reverse, region 160 will dissolve back into the ion conductor and the device will return to a high resistance state. In a similar fashion, an effective barrier height of a diode that forms between an ion conductor and an electrode can be reduced by growing region 160; thus current flow may be increased through the structure, even if the resistance of the structure is substantially the same.

Structures 100 and 200 may be used to store information and thus may be used in memory circuits. For example, structure 100 or other programmable structures in accordance with the present invention may suitably be used in memory devices to replace DRAM, SRAM, PROM, EPROM, EEPROM, FPGA devices, or any combination of such memory. In addition, programmable structures of the present invention may be used for other applications where programming or changing of electrical properties of a portion of an electrical circuit are desired, such as in programmable logic devices.

In accordance with various embodiments of the invention, the volatility of programmable memory (e.g., cell 100 or 200) can be manipulated by altering an amount of energy (e.g., altering time, current, voltage, thermal energy, and/or the like) applied during a write process. In the case where region 160 forms during a write process, the greater the amount of energy (having a voltage greater than the threshold voltage for the write process) applied during the write process, the greater the growth of region 160 and hence the less volatile the memory. Conversely, relatively volatile, easily erased memory can be formed by supplying relatively little energy to the cell. Thus, relatively volatile memory can be formed using the same or similar structures used to form nonvolatile memory, and less energy can be used to form the volatile/easily erased memory. Use of less energy is particularly desirable in portable electronic devices that depend on stored energy for operation. The volatile and nonvolatile memory may be formed on the same substrate and partitioned or separated from each other such that each partition is dedicated to either volatile or nonvolatile memory; or, an array of memory cells may be configured as volatile or nonvolatile memory using programming techniques, such that the configuration (i.e., volatile or nonvolatile) of the memory can be altered by changing an amount of energy supplied during programming the respective portions of the memory array.

Referring again to FIGS. 1 and 2, substrate 110 may include any suitable material. For example, substrate 110 may include semiconductive, conductive, semiinsulative, insulative material, or any combination of such materials. In accordance with one embodiment of the invention, substrate 110 includes an insulating material 112 and a portion 114 including a microelectronic device formed using a portion of the substrate. Layer 112 and portion 114 may be separated by additional layers (not shown) such as, for example, layers typically used to form integrated circuits. Because the programmable structures can be formed over insulating or other materials, the programmable structures of the present invention are particularly well suited for applications where substrate (e.g., semiconductor material) space is a premium. In addition, forming a memory cell overlying a microelectronic device may be advantageous because such a configuration allows greater data transfer between an array of memory cells and the microelectronic device using, for example, conductive plugs formed within layers 112 and 150.

Electrodes 120 and 130 may be formed of any suitable conductive material. For example, electrodes 120 and 130 may be formed of doped silicon or polysilicon material or metal. As set forth in more detail below, in accordance with various embodiments of the invention, at least one of electrodes 120, 130 includes doped silicon or polysilicon material, which forms an integrated diode with conductive region 160. The integrated diode can be used for passive isolation of the programmable structure.

In accordance with one exemplary embodiment of the invention, one of electrodes 120 and 130 is formed of a material including a metal that dissolves in ion conductor 140 when a sufficient bias ($V \geq V_T$) is applied across the electrodes (an oxidizable electrode) and the other electrode is relatively inert and does not dissolve during operation of the programmable device (an indifferent electrode). For example, electrode 120 may be an anode during a write process and be comprised of a material including silver that dissolves in ion conductor 140 and electrode 130 may be a cathode during the write process and be comprised of an inert material such as tungsten, nickel, molybdenum, platinum, metal silicides, doped semiconductor material, doped polysilicon material, and the like. Having at least one electrode formed of a material including a metal, which dissolves in ion conductor 140 facilitates maintaining a desired dissolved metal concentration within ion conductor 140, which in turn facilitates rapid and stable region 160 formation within ion conductor 140 or other electrical property change during use of structure 100 and/or 200. Furthermore, use of an inert material for the other electrode (cathode during a write operation) facilitates electrodissolution of any region 160 that may have formed and/or return of the programmable device to an erased state after application of a sufficient voltage.

During an erase operation, dissolution of any region 160 that may have formed preferably begins at or near the oxidizable electrode/region 160 interface. Initial dissolution of the region 160 at the oxidizable electrode/region 160 interface may be facilitated by forming structure 100 such that the resistance at the oxidizable electrode/region 160 interface is greater than the resistance at any other point along region 160, particularly, the interface between region 160 and the indifferent electrode.

One way to achieve relatively low resistance at the indifferent electrode is to form the electrode of relatively inert, non-oxidizing material such as platinum. Use of such material reduces formation of oxides at the interface between ion conductor 140 and the indifferent electrode as well as the formation of compounds or mixtures of the electrode material and ion conductor 140 material, which typically have a higher resistance than ion conductor 140 or the electrode material.

Relatively low resistance at the indifferent electrode may also be obtained by forming a barrier layer between the oxidizable electrode (anode during a write operation) and the ion conductor, wherein the barrier layer is formed of material having a relatively high resistance. Exemplary high resistance materials are discussed in more detail below.

Reliable growth and dissolution of region 160 can also be facilitated by providing a roughened indifferent electrode surface (e.g., a root mean square roughness of greater than about 1 nm) at the electrode/ion conductor interface. The roughened surface may be formed by manipulating film deposition parameters and/or by etching a portion of one of the electrode or ion conductor surfaces. During a write operation, relatively high electrical fields form about the spikes or peaks of the roughened surface, and thus regions 160 are more likely to form about the spikes or peaks. As a result, more reliable and uniform changes in electrical properties for an applied voltage across electrodes 120 and 130 may be obtained by providing a roughed interface between the indifferent electrode (cathode during a write operation) and ion conductor 140.

Oxidizable electrode material may have a tendency to thermally dissolve or diffuse into ion conductor 140, particularly during fabrication and/or operation of structure 100. The thermal diffusion is undesired because it may reduce the resistance of structure 100 and thus reduce the change of an electrical property during use of structure 100.

To reduce undesired diffusion of oxidizable electrode material into ion conductor 140 and in accordance with various embodiments of the invention, the oxidizable electrode includes a metal intercalated in a transition metal sulfide or selenide material such as $A_x(MB_2)_{1-x}$, where A is Ag or Cu, B is S or Se, M is a transition metal such as Ta, V, and Ti, and x ranges from about 0.1 to about 0.7. The intercalated material mitigates undesired thermal diffusion of the metal (Ag or Cu) into the ion conductor material, while allowing the metal to participate in region 160 growth upon application of a sufficient voltage across electrodes 120 and 130. For example, when silver is intercalated into a $TaS_2$ film, the $TaS_2$ film can include up to about 67 atomic percent silver. The $A_x(MB_2)_{1-x}$ material is preferably amorphous to prevent undesired diffusion of the metal though the material. The amorphous material may be formed by, for example, physical vapor deposition of a target material comprising $A_x(MB_2)_{1-x}$.

α-AgI is another suitable material for the oxidizable electrode. Similar to the $A_x(MB_2)_{1-x}$ material discussed above, α-AgI can serve as a source of Ag during operation of structure 100—e.g., upon application of a sufficient bias, but the silver in the AgI material does not readily thermally diffuse into ion conductor 140. AgI has a relatively low activation energy for conduction of electricity and does not require doping to achieve relatively high conductivity. When the oxidizable electrode is formed of AgI, depletion of silver in the AgI layer may arise during operation of structure 100, unless excess silver is provided to the electrode. One way to provide the excess silver is to form a silver layer adjacent the AgI layer. When interposed between a layer of silver and ion conductor 140, the AgI layer reduces thermal diffusion of Ag into ion conductor 140, but does not significantly affect conduction of Ag during operation of structure 100. In addition, use of AgI increases the operational efficiency of structure 100 because the AgI mitigates non-Faradaic conduction (conduction of electrons that do not participate in the electrochemical reaction).

In accordance with one embodiment of the invention, at least one electrode 120 and 130 is formed of material suitable for use as an interconnect metal. For example, electrode 130 may form part of an interconnect structure within a semiconductor integrated circuit. In accordance with one aspect of this embodiment, electrode 130 is formed of a material that is substantially insoluble in material comprising ion conductor 140. Exemplary materials suitable for both interconnect and electrode 130 material include metals and compounds such as tungsten, nickel, molybdenum, platinum, metal silicides, and the like.

As noted above, programmable structures of the present invention may include one or more barrier or buffer layers 155, 255 interposed between at least a portion of ion conductor 140 and one of the electrodes 120, 130. Layers 155, 255 may include ion conductors such as $Ag_xO$, $Ag_xS$, $Ag_xSe$, $Ag_xTe$, where $x \geq 2$, $Ag_yI$, where $x \geq 1$, $CuI_2$, $CuO$, $CuS$, $CuSe$, $CuTe$, $GeO_2$, $Ge_zS_{1-z}$, $Ge_zSe_{1-z}$, $Ge_zTe_{1-z}$, $As_zS_{1-z}$, $As_zSe_{1-z}$, $As_zTe_{1-z}$, where z is greater than or equal to about 0.1, $SiO_x$, where x ranges from about 1 to about 2, and combinations of these materials) interposed between ion conductor 140 and a metal layer such as silver.

Other materials suitable for buffer layers 155 and/or 255 include $GeO_2$. Amorphous $GeO_2$ is relatively porous an will "soak up" silver during operation of device 100, but will retard the thermal diffusion of silver to ion conductor 140, compared to structures or devices that do not include a buffer layer. When ion conductor 140 includes germanium, $GeO_2$ may be formed by exposing ion conductor 140 to an oxidizing environment at a temperature of about 300° C. to about 800° C. or by exposing ion conductor 140 to an oxidizing environment in the presence of radiation having an energy greater than the band gap of the ion conductor material. The $GeO_2$ may also be deposited using physical vapor deposition (from a $GeO_2$ target) or chemical vapor deposition (from $GeH_4$ and an $O_2$).

Buffer layers can also be used to increase the off resistance and "write voltage" by placing a high-resistance buffer layer (e.g., $GeO_2$, $SiO_x$, air, a vacuum, or the like) between ion conductor 140 and the indifferent electrode. In this case, the high-resistance buffer material allows metal such as silver to diffuse though or plate across the buffer and take part in the electrochemical reaction.

When the barrier layer between the indifferent electrode and the ion conductor includes a high resistance material, the barrier may include ions that contribute to electrodeposit growth or the barrier may be devoid of ions. In either case, the barrier must be able to transmit electrons, by conduction or tunneling, such that the redox reaction occurs, allowing for region 160 growth.

In some cases, an electrodeposit may form within the high-resistance barrier layer. Exemplary high-resistance barrier layers that support electrodeposit growth include gas-filled or vacuum gap regions, porous oxide films, or other high-resistance glassy materials, and semiconductor material as long as the barrier is thin enough to allow electron tunneling from the cathode to the ion conductor at reasonable voltages (e.g., less than or equal to about 1 volt), can support electron transport, and can allow ions to be reduced within the barrier material volume.

Layers 155 and/or 255 may also include a material that restricts migration of ions between conductor 140 and the electrodes. In accordance with exemplary embodiments of the invention, a barrier layer includes conducting material such as titanium nitride, titanium tungsten, a combination thereof, or the like. The barrier may be electrically indifferent, i.e., it allows conduction of electrons through structure 100 or 200, but it does not itself contribute ions to conduction through structure 200. An electrically indifferent barrier may reduce undesired electrodeposit growth during operation of the programmable device, and thus may facilitate an "erase" or dissolution of region 160 when a bias is applied which is opposite to that used to grow region 160. In addition, use of a conducting barrier allows for the "indifferent" electrode to be formed of oxidizable material, such as silver, copper, or the like, because the barrier prevents diffusion of the electrode material to the ion conductor.

As noted above and as set forth in more detail below, in accordance with various embodiments of the invention, at least one barrier layer 155, 255 is formed of doped semiconductor material, such that as conductive region 160 forms, a Schottky diode, including the doped semiconductor material and the conductive region, forms. This diode may serve to isolate the programmable structure from other programmable structures.

Ion conductor 140 is formed of material that conducts ions upon application of a sufficient voltage. Suitable materials for ion conductor 140 include polymers, glasses and semiconductor materials. In general, ion conductors in accordance with the present invention can conduct ions without requiring a phase change, can conduct ions at a relatively low temperature (e.g., below 125° C.), can conduct ions at relatively low electrical currents, have a relatively high transport number, and exhibit relatively high ion conductivity. In one exemplary embodiment of the invention, ion conductor 140 is formed of chalcogenide material. However, other materials may be used as an ion conductor in accordance with various embodiments of the invention.

Ion conductor 140 may also suitably include dissolved conductive material. For example, ion conductor 140 may comprise a solid solution that includes dissolved metals and/or metal ions. In accordance with one exemplary embodiment of the invention, conductor 140 includes metal and/or metal ions dissolved in chalcogenide glass. An exemplary chalcogenide glass with dissolved metal in accordance with the present invention includes a solid solution of $As_xS_{1-x}$—Ag, $As_xSe_{1-x}$—Ag, $As_xTe_{1-x}$—Ag, $Ge_xSe_{1-x}$—Ag, $Ge_xS_{1-x}$—Ag, $Ge_xTe_{1-x}$—Ag, $As_xS_{1-x}$—Cu, $As_xSe_{1-x}$—Cu, $As_xTe_{1-x}$—Cu, $Ge_xSe_{1-x}$—Cu, $Ge_xS_{1-x}$—Cu, and $Ge_xTe_{1-x}$—Cu where x ranges from about 0.1 to about 0.5, other chalcogenide materials including silver, copper, combinations of these materials, and the like. In addition, conductor 140 may include network modifiers that affect mobility of ions through conductor 140. For example, materials such as metals (e.g., silver), halogens, halides, or hydrogen may be added to conductor 140 to enhance ion mobility and thus increase erase/write speeds of the structure. Furthermore, as discussed in more detail below, ion conductor 140 may include a plurality of regions having different resistance values—for example, ion conductor 140 may include a first region proximate the oxidizable electrode having a relatively low resistance and a second region proximate the indifferent electrode having a relatively high resistance.

By way of particular example, a composition of ion conductor 140 is selected to facilitate the ion conductor withstanding temperatures (e.g., processing temperatures and/or higher temperatures due to higher programming currents) of up to about 450° C., without degradation of device parameters, such as write threshold voltage. This may be desirable to allow, for example, subsequent standard back end of line BEOL processing.

Figure 31:
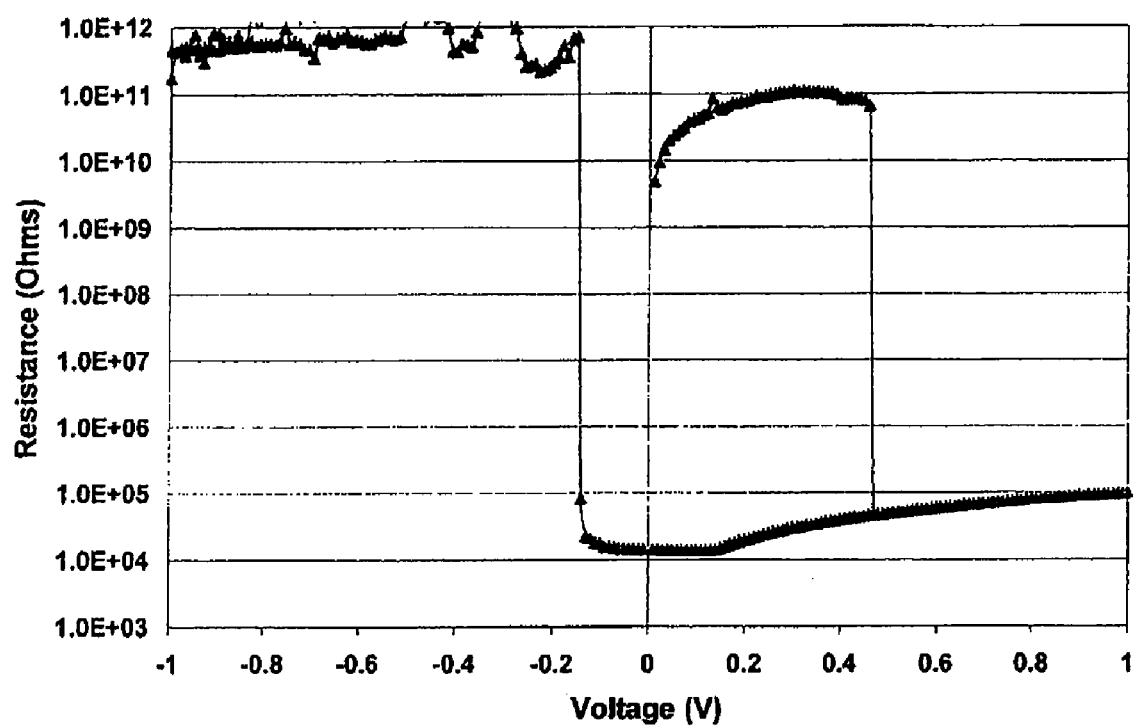
FIG. 31 illustrates a resistance voltage diagram for an exemplary programmable structure.

In the case of $Ge_xS_{1-x}$ based ion conductors, x is preferably between 0.35 and 0.45, and more preferably about 0.39 to provide stability for temperatures above about 350° C. and maintain relatively high switching speeds. FIG. 31 illustrates a resistance voltage plot of a 1 µm, 70 nm thick $Ag$—$Ge_{0.39}S_{0.61}$ device, formed within a via and having a tungsten bottom electrode and a silver top electrode, following annealing at 430° C. As illustrated, the device switches from around $10^{11}\Omega$ to about 14 kΩ for a 10 µA write current limit and transitions back to the off state at −150 mV.

To increase the thermal stability of ion conductor, doped oxides and/or oxide-doped chalcogenides are used as ion conductor 140. Exemplary oxide dopants for chalcogenide materials include oxygen, $GeO_2$, $As_2O_3$, $Ag_2O$, $Cu_{(1,2)}O$, and $SiO_2$ and exemplary oxides suitable for doping include silver or copper doped $GeO_2$, $As_2O_3$, $Ag_2O$, $Cu_{(1,2)}O$, $WO_x$ and other transition metal oxides and $SiO_x$. In the case of doped oxides, ion conductor 140 is preferably less than about 10 nm thick.

Ion conductor 140 may also include a filler material, which fills interstices or voids. Suitable filler materials include non-oxidizable and non-silver based materials such as a non-conducting, immiscible silicon oxide and/or silicon nitride, having a cross-sectional dimension of less than about 1 nm, which do not contribute to the growth of region 160. In this case, the filler material is present in the ion conductor at a volume percent of up to about 5 percent to reduce a likelihood that a region 160 will spontaneously dissolve into the supporting ternary material as the device is exposed to elevated temperature, which leads to more stable device operation without compromising the performance of the device. Ion conductor 140 may also include filler material to reduce an effective cross-sectional area of the ion conductor. In this case, the concentration of the filler material, which may be the same filler material described above but having a cross-sectional dimension up to about 50 nm, is present in the ion conductor material at a concentration of up to about 50 percent by volume.

In accordance with one exemplary embodiment of the invention, ion conductor 140 includes a germanium-selenide glass with silver diffused in the glass. Germanium selenide materials are typically formed from selenium and $Ge(Se)_{4/2}$ tetrahedra that may combine in a variety of ways. In a Se-rich region, Ge is 4-fold coordinated and Se is 2-fold coordinated, which means that a glass composition near $Ge_{0.20}Se_{0.80}$ will have a mean coordination number of about 2.4. Glass with this coordination number is considered by constraint counting theory to be optimally constrained and hence very stable with respect to devitrification. The network in such a glass is known to self-organize and become stress-free, making it easy for any additive, e.g., silver, to finely disperse and form a mixed-glass solid solution. Accordingly, in accordance with one embodiment of the invention, ion conductor 140 includes a glass having a composition of $Ge_{0.17}Se_{0.83}$ to $Ge_{0.25}Se_{0.75}$.

When conductive material such as metal is added to an ion conductor material, phase-separated regions of the metal-doped ion conductor may form. In this case, a macroscopic view of the doped ion conductor may appear glassy even though small, phases-separated regions are formed.

Figure 3:
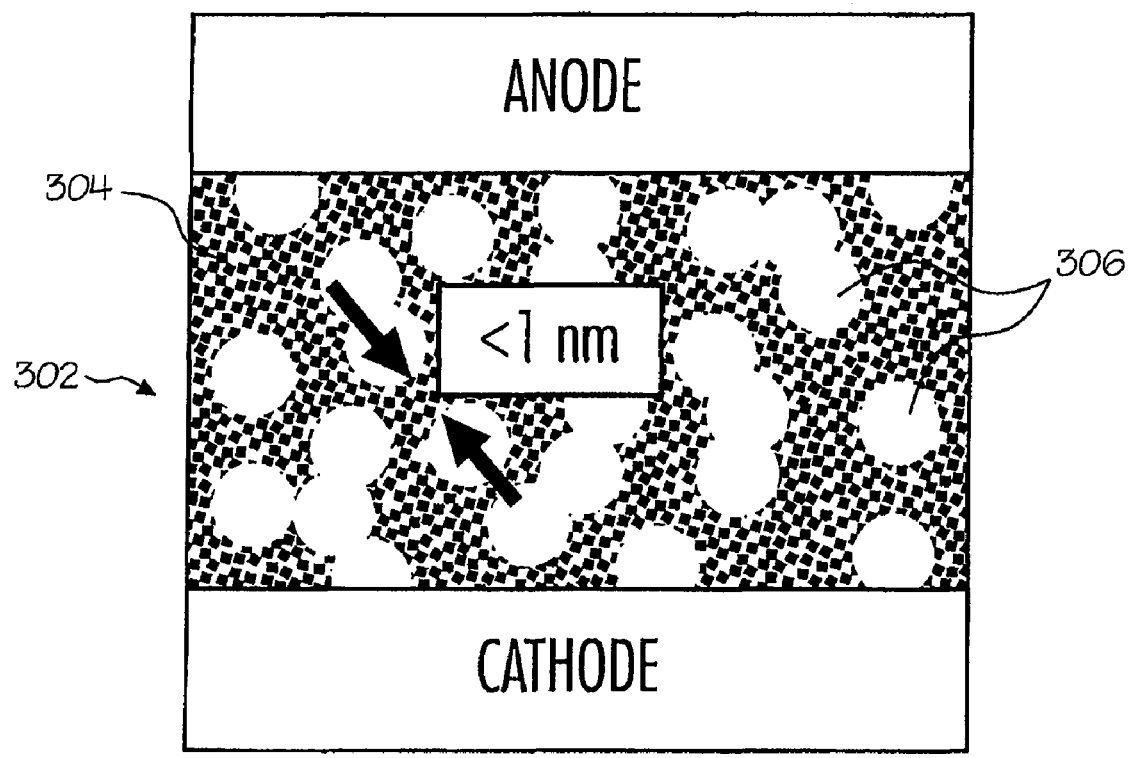
FIGS. 3-5 are cross-sectional illustrations of a programmable structure in accordance with another embodiment of the present invention, illustrating phase-separated ion conductors.
Figure 4:
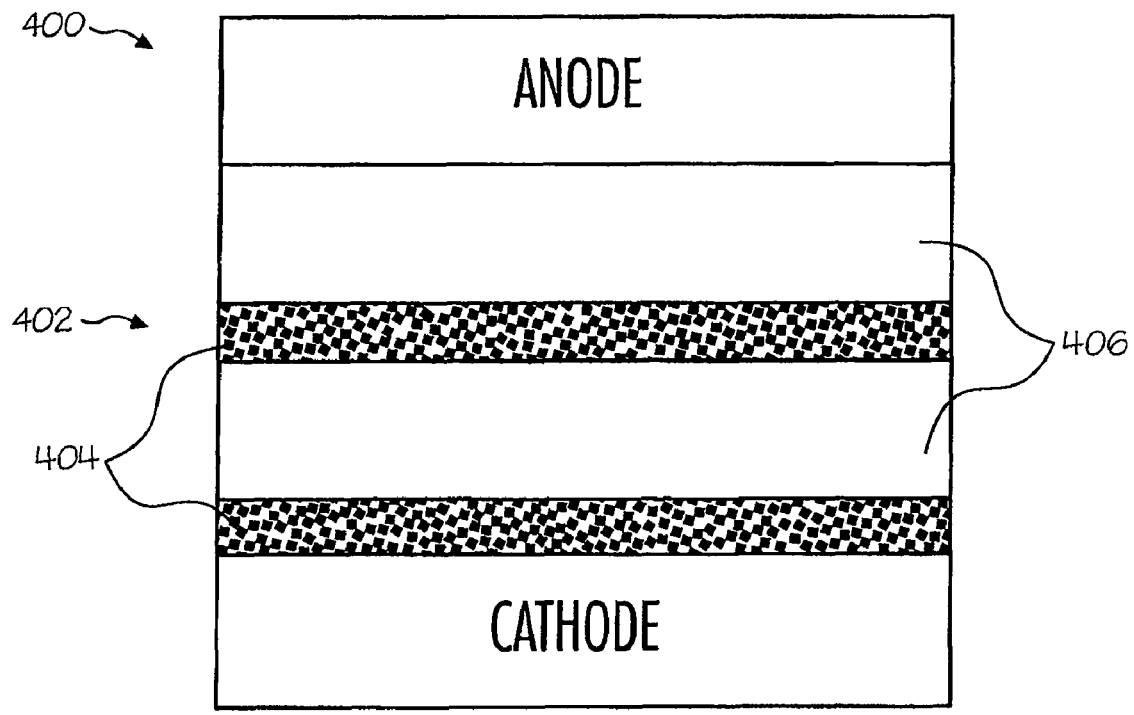
Figure 5:
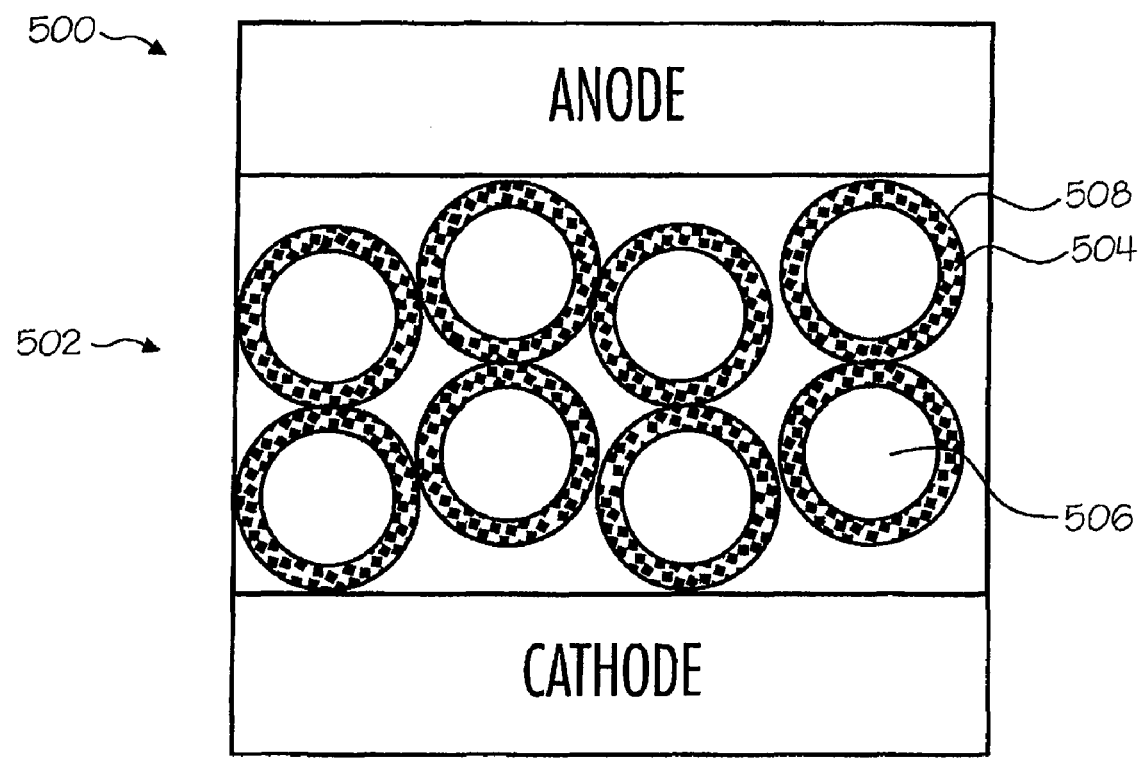

FIGS. 3-5 illustrate portions of programmable structures, which include phase-separated ion conductor material, in accordance with various embodiments of the present invention. FIG. 3 illustrates a phase-separated ion conductor region 302, including a high-resistance portion 304 and low-resistance portions 306. By way of particular example, when ion conductor 302 includes silver doped $Ge_xSe_{1-x}$, where x is less than about 0.33 and preferably ranges from about 0.17 to about 0.3 and more preferably has a value of about 0.17 to about 0.25, ion conductor separates into a first phase 304 of Ge—Se (e.g., $Ge_2Se_3$) having a relatively high resistivity of greater than about $10^3$ ohm-cm and a second phase 306 of $Ag_2Se$, which is much more conductive that Ge—Se portion 304, having an ion resistivity of about 0.3 ohm-cm and an ion mobility of about $10^{-4}$ cm$^2$/V·s. In this case, phase-separated ion conductor 302 has an overall resistivity of about 100 ohm-cm and is stable at room temperature.

It is thought that phase-separated ion conductors facilitate large off resistance and high switching speed of programmable devices such as device 100. The reason for this is that the metal ions from the soluble electrode will migrate within region 304 to bridge low-resistance regions 306. Reduction of metal ions preferentially occurs in high-resistance regions 304 because the local field is highest in this area of ion conductor 302. This process is relatively fast because a typical gap between low-resistance portions is on the order of about 1 nm or less.

Other exemplary materials suitable for phase-separated ion-conductor material include silver and/or copper-doped germanium chalcogenides (e.g., sulfides and tellurides) and mixtures of these compounds, silver and/or copper-doped arsenic chalcogenides (e.g., selenides, sulfides, and tellurides) and mixtures of these compounds. Other exemplary phase-separate ion conductors include $Ag_2Se$ dispersed within AgI or within an ion conductive polymer such as poly(ethylene oxide) and additional exemplary high-resistance material suitable for portion 304 include $SiO_x$, $GeO_2$, and $Ag_2O$. It should be noted, however, that any ion conductor material that includes a low-resistance phase dispersed within a high-resistance phase will function in accordance with the present invention as described herein.

FIG. 4 illustrates a structure 400, including a phase-separated ion conductor 402. Ion conductor 402 includes high-resistance portions 404 and low-resistance portions 406. Portions 404 and 406 may be formed of corresponding high-resistance and low-resistance material described above in connection with portions 304 and 306. Structure 400 may be formed by sequentially depositing high-resistivity material and low-resistance material. Although illustrated with only two high-resistance portions and two low-resistance portions, structures in accordance with the present invention may include any desired number of low and high-resistivity portions.

Similar to the operation of structure 300, the operation speed of structure 400 is primarily limited by the change of resistance of high-resistance portions 404. Accordingly, operational speed of structures 400 can be manipulated by altering a thickness of layer(s) 404.

FIG. 5 illustrates another structure 500, which includes phase separated ion conductor material 502. Structure 500 is similar to structures 300 and 400, except that structure 500 includes particles 508, including a high-resistance portion 504 and a low-resistance portion 506, which may be formed of low and high-resistance materials described herein.

Referring again to FIGS. 1 and 2, in accordance with one exemplary embodiment of the invention, at least a portion of structure 100 is formed within a via of an insulating material 150. Forming a portion of structure 100 within a via of an insulating material 150 may be desirable because, among other reasons, such formation allows relatively small structures, e.g., on the order of 10 nanometers, to be formed. In addition, insulating material 150 facilitates isolating various structures 100 from other electrical components.

Insulating material 150 suitably includes material that prevents undesired diffusion of electrons and/or ions from structure 100. In accordance with one embodiment of the invention, material 150 includes silicon nitride, silicon oxynitride, polymeric materials such as polyimide or parylene, or any combination thereof.

A contact 165 may suitably be electrically coupled to one or more electrodes 120, 130 to facilitate forming electrical contact to the respective electrode. Contact 165 may be formed of any conductive material and is preferably formed of a metal, alloy, or composition including aluminum, tungsten, or copper.

In accordance with one embodiment of the invention, structure 100 is formed by forming electrode 130 on substrate 110. Electrode 130 may be formed using any suitable method such as, for example, depositing a layer of electrode 130 material, patterning the electrode material, and etching the material to form electrode 130. Insulating layer 150 may be formed by depositing insulating material onto electrode 130 and substrate 110 and forming vias in the insulating material using appropriate patterning and etching processes. Ion conductor 140 and electrode 120 may then be formed within insulating layer 150 by depositing ion conductor 140 material and electrode 120 material within the via. Such ion conductor and electrode material deposition may be selective—i.e., the material is substantially deposited only within the via, or the deposition processes may be relatively non-selective. If one or more non-selective deposition methods are used, any excess material remaining on a surface of insulating layer 150 may be removed using, for example, chemical mechanical polishing and/or etching techniques. Barrier layers 155 and/or 255 may similarly be formed using any suitable deposition and/or etch processes.

A solid solution suitable for use as ion conductor 140 may be formed in a variety of ways. For example, the solid solution may be formed by depositing a layer of conductive material such as metal over a chalcogenide glass or other ion conductor material without breaking a vacuum and exposing the metal and glass to thermal and/or photo dissolution processing. In accordance with one exemplary embodiment of the invention, a solid solution of $As_2S_3$—Ag is formed by depositing $As_2S_3$ onto a substrate, depositing a thin film of Ag onto the $As_2S_3$, and exposing the films to light having energy greater than the optical gap of the $As_2S_3$, —e.g., light having a wavelength of less than about 500 nanometers (e.g., light having a wavelength of about 436 nm at about 6.5 mW/cm$^2$). With this process the chalcogenide glass can incorporate over 30 atomic percent of silver and remain macroscopically glassy and microscopically phase separated. If desired, network modifiers may be added to conductor 140 during deposition of conductor 140 (e.g., the modifier is in the deposited material or present during conductor 140 material deposition) or after conductor 140 material is deposited (e.g., by exposing conductor 140 to an atmosphere including the network modifier).

In accordance with another embodiment of the invention, a solid solution may be formed by depositing one of the constituents from a source onto a substrate or another material layer and reacting the first constituent with a second constituent. For example, germanium (preferably amorphous) may be deposited onto a portion of a substrate and the germanium may be reacted with $H_2Se$ to form a Ge—Se glass. Similarly, arsenic can be deposited and reacted with the $H_2Se$ gas, or arsenic or germanium can be deposited and reacted with $H_2S$ gas. Silver or other metal can then be added to the glass as described above.

When used, oxides may be added to the ion conductor material by adding an oxide to a melt used to form a chalcogenide ion conductor source. For example, $GeO_2$, $As_2O_3$, $Ag_2O$, $Cu_{(1,2)}O$, and $SiO_2$, can be added to $Ge_xS_{1-x}$, $As_xS_{1-x}$, $Ge_xSe_{1-x}$, $As_xSe_{1-x}$, $Ge_xTe_{1-x}$, $As_xTe_{1-x}$ to form an oxide-chalcogenide glass including up to several tens of atomic percent oxygen. The ternary or quaternary glass can then be used to deposit a film of similar composition on the device substrate by physical vapor deposition or similar technique. Alternatively, the oxygen-containing film may be formed in-situ using reactive deposition techniques in which the chalcogenide material is deposited in a reactive oxygen ambient to form an ion conductor including up to several tens of atomic percent of bound oxygen. Conductive material such as silver or copper can be incorporated into the source glass melt or introduced into the deposited film by thermal or photo-dissolution as discussed above.

Similarly, metal doped oxides may be deposited from a synthesized source which contains all the necessary elements in the correct proportions (e.g., $Ag_xO$ (x>2), $Cu_xO$ (x>2), Ag/Cu—$GeO_2$, Ag/Cu—$As_2O_3$, or Ag/Cu—$SiO_2$) or the silver or copper may be introduced into the binary oxide film ($Ag_2O$, $Cu_{(1,2)}O$, $GeO_2$, $As_2O_3$, or $SiO_2$) by thermal- or photo-dissolution from a thin surface layer of the metal. Alternatively, a base layer of Ag, Cu, Ge, As, or Si may be deposited first and then reacted with oxygen to form the appropriate oxide and then diffused with Ag or Cu as discussed above. The oxygen reaction could be purely thermal or plasma-assisted, the latter producing a more porous oxide.

One of the electrodes may be formed during ion conductor 140 doping by depositing sufficient metal onto an ion conductor material and applying sufficient electrical or thermal energy to the layers such that a portion of the metal is dissolved within the ion conductor material and a portion of the metal remains on a surface of the ion conductor to form an electrode (e.g., electrode 120). Regions of differing conductivity within ion conductor 140 can be formed using this technique by applying a sufficient amount of energy to the structure such that a first portion of the ion conductor proximate the soluble electrode contains a greater amount of conductive material than a second portion of the ion conductor proximate the indifferent electrode. This process is self limiting if the starting ion conductor layer is thick enough so that a portion of the film becomes saturated and a portion of the film is unsaturated.

In accordance with alternative embodiments of the invention, solid solutions containing dissolved metals may be directly deposited onto substrate 110 and the electrode then formed overlying the ion conductor. For example, a source including both chalcogenide glass and conductive material can be used to form ion conductor 140 using physical vapor deposition or similar techniques.

An amount of conductive material such as metal dissolved in an ion conducting material such as chalcogenide may depend on several factors such as an amount of metal available for dissolution and an amount of energy applied during the dissolution process. However, when a sufficient amount of metal and energy are available for dissolution in chalcogenide material using photodissolution, the dissolution process is thought to be self limiting, substantially halting when the metal cations have been reduced to their lowest oxidation state. In the case of $As_2S_3$—Ag, this occurs at $Ag_4As_2S_3=2Ag_2S+As_2S$, having a silver concentration of about 47 atomic percent. If, on the other hand, the metal is dissolved in the chalcogenide material using thermal dissolution, a higher atomic percentage of metal in the solid solution may be obtained, provided a sufficient amount of metal is available for dissolution.

In accordance with a further embodiment of the invention, the solid solution is formed by photodissolution to form a macrohomogeneous ternary compound and additional metal is added to the solution using thermal diffusion (e.g., in an inert environment at a temperature of about 85° C. to about 150° C.) to form a solid solution containing, for example, about 30 to about 50, and preferably about 34 atomic percent silver. Ion conductors having a metal concentration above the photodissolution solubility level facilitates formation of regions 160 that are thermally stable at operating temperatures (typically about 85° C. to about 150° C.) of devices 100 and 200. Alternatively, the solid solution may be formed by thermally dissolving the metal into the ion conductor at the temperature noted above; however, solid solutions formed exclusively from photodissolution are thought to be less homogeneous than films having similar metal concentrations formed using photodissolution and thermal dissolution.

Information may be stored using programmable structures of the present invention by manipulating one or more electrical properties of the structures. For example, a resistance of a structure may be changed from a "0" or off state to a "1" or on state during a suitable write operation. Similarly, the device may be changed from a "1" state to a "0" state during an erase operation. In addition, as discussed in more detail below, the structure may have multiple programmable states such that multiple bits of information are stored in a single structure.

Write Operation

Figure 6:
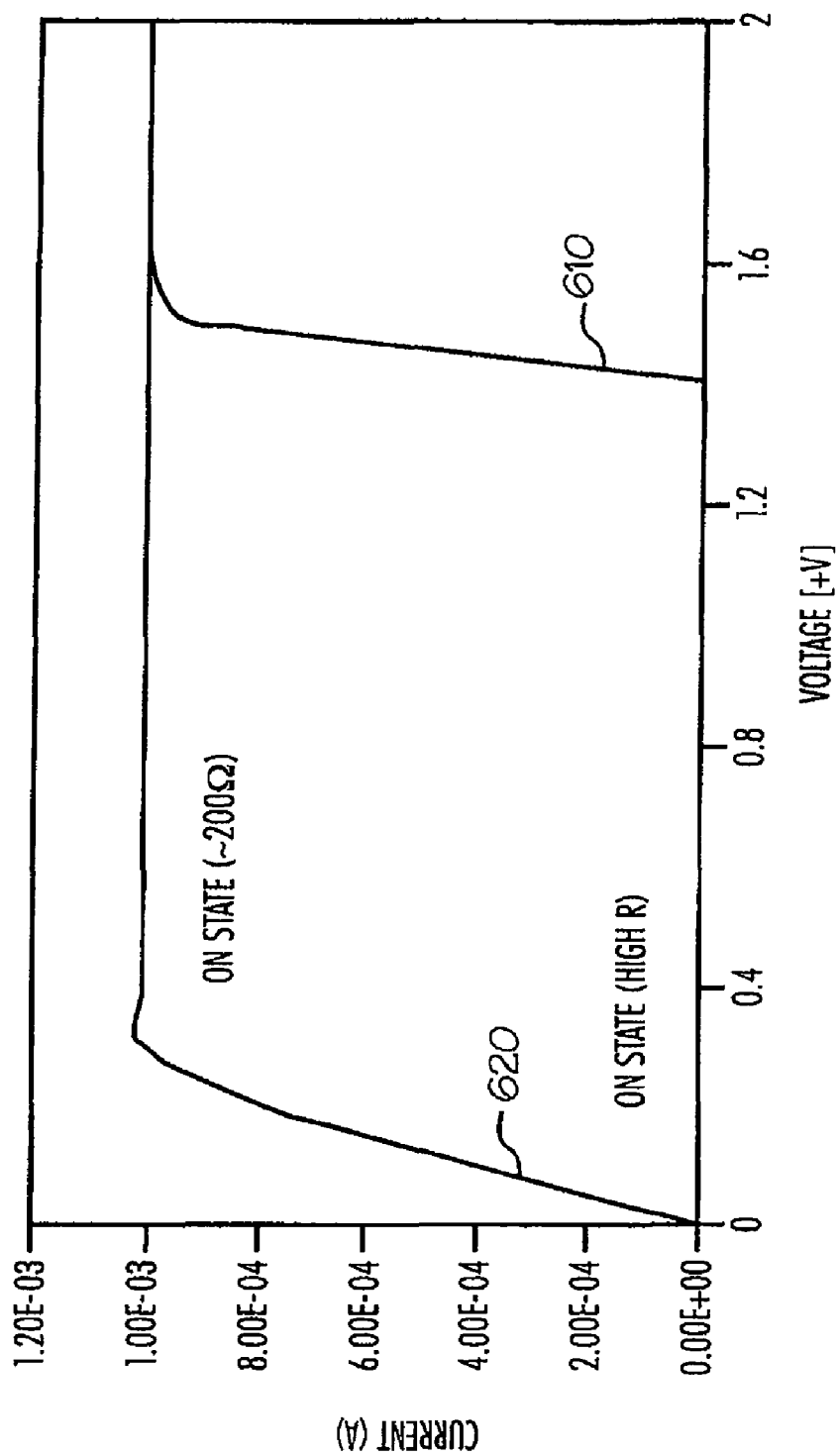
FIGS. 6, 8, and 9 are current-voltage diagrams illustrating current and voltage characteristics of the devices of the present invention.

FIG. 6 illustrates current-voltage characteristics of a programmable structure (e.g. structure 200) in accordance with the present invention. In the illustrated embodiment, via diameter, D, is about 4 microns, conductor 140 is about 35 nanometers thick and formed of $Ge_3Se_7$—Ag (near $Ag_8Ge_3Se_7$), electrode 130 is indifferent and formed of nickel, electrode 120 is formed of silver, and barrier 255 is a native nickel oxide. As illustrated in FIG. 6, current through structure 200 in an off state (curve 610) begins to rise upon application of a bias of over about one volt; however, once a write step has been performed (i.e., an electrodeposit has formed), the resistance through conductor 140 drops significantly (i.e., to about 200 ohms), illustrated by curve 620 in FIG. 6. As noted above, when electrode 130 is coupled to a more negative end of a voltage supply, compared to electrode 120, a conductive region begins to form near electrode 130 and grow toward electrode 120. An effective threshold voltage (i.e., voltage required to cause growth of the conductive region and to break through barrier 255, thereby coupling electrodes 120, 130 together) is relatively high because of barrier 255. In particular, a voltage $V \geq V_T$ must be applied to structure 200 sufficient to cause electrons to tunnel through barrier 255 (when barrier 255 comprises an insulating layer) to form the conductive region and to overcome the barrier (e.g., by tunneling through or leakage) and conduct through conductor 140 and at least a portion of barrier 255.

In accordance with alternate embodiments of the invention, where no insulating barrier layer is present, an initial "write" threshold voltage is relatively low because no insulative barrier is formed between, for example, ion conductor 140 and either of the electrodes 120, 130.

As noted above, the relative volatility of the memory structures of the present invention may be altered by applying different amounts of energy to the structures during a write process. For example, a relatively high current pulse of a few hundred microamperes for a period of about several hundred nanoseconds may be applied to the structures illustrated in FIGS. 1 and 2 to form a relatively nonvolatile memory cell. Alternatively, the same current may be supplied to the same or similar memory structure for a shorter amount of time, e.g., several nanoseconds to form a relatively volatile memory structure. In either case, the memory of the present invention can be programmed at relatively high speeds and even the "volatile" memory is relatively nonvolatile compared to traditional DRAM. For example, the volatile memory may operate at speed comparable to DRAM and only require refreshing every several hours.

Read Operation

A state of a memory cell (e.g., 1 or 0) may be read, without significantly disturbing the state, by, for example, applying a forward or reverse bias of magnitude less than a voltage threshold (about 1.4 V for a structure illustrated in FIG. 6) for electrodeposition or by using a current limit which is less than or equal to the minimum programming current (the current which will produce the highest of the on resistance values). A current limited (to about 1 milliamp) read operation is illustrated in FIG. 6. In this case, the voltage is swept from 0 to about 2 V and the current rises up to the set limit (from 0 to 0.2 V), indicating a low resistance (ohmic/linear current-voltage) "on" state. Another way of performing a non-disturb read operation is to apply a pulse, with a relatively short duration, which may have a voltage higher than the electrochemical deposition threshold voltage such that no appreciable Faradaic current flows, i.e., nearly all the current goes to polarizing/charging the device and not into the electrodeposition process.

In accordance with various embodiments of the invention, circuits including the programmable structures include temperature compensation devices to mitigate effects of temperature variation on the performance of the programmable device. One exemplary temperature compensation circuit includes a programmable structure having a known erased state. In this case, during a read operation, a progressively increasing voltage is applied to a programmable structure having an unknown state as well as to the structure having the known erased state. If the unknown structure has been written to, it will switch on before the known erased device and if the unknown structure is in an erased state, the two devices will switch on at approximately the same time. Alternatively, a temperature compensation circuit can be used to produce a comparison voltage or current to be compared to a voltage or current produced by a programmable structure of an unknown state during a read process.

Erase Operation

A programmable structure (e.g., structure 200) may suitably be erased by reversing a bias applied during a write operation, wherein a magnitude of the applied bias is equal to or greater than the threshold voltage for electrodeposition in the reverse direction. In accordance with an exemplary embodiment of the invention, a sufficient erase voltage ($V \geq V_T$) is applied to structure 200 for a period of time, which depends on energy supplied during the write operation, but is typically less than about 1 millisecond to return structure 200 to its "off" state having a resistance well in excess of a million ohms. In cases where the programmable structure does not include a barrier between conductor 140 and electrode 120, a threshold voltage for erasing the structure is much lower than a threshold voltage for writing the structure because, unlike the write operation, the erase operation does not require electron tunneling through a barrier or barrier breakdown.

Pulse Mode Read/Write

In accordance with an alternate embodiment of the invention, pulse mode programming is used to write to and read from a programmable structure. In this case, similar to the process described above, region 160 forms during a write process; however, unlike the process described above, at least a portion region 160 is removed or dissolved during a read operation. During an erase/read process, the magnitude of the current pulse is detected to determine the state (1 or 0) of the device. If the device had not previously been written to or has previously been erased, no ion current pulse will be detected at or above the reduction/oxidation potential of the structure. But, if the device is in a written state, an elevated current will be detected during the destructive read/erase step. Because this is a destructive read operation, information must be written to each structure after each read process—similar to DRAM read/write operations. However, unlike DRAM devices, the structures of the present invention are stable enough to allow a range of values to be stored (e.g., various amounts of region 160). Thus, a partially destructive read that decreases, but does not completely eliminate region 160, can be used. In accordance with an alternate aspect of this embodiment, a destructive write process rather than a destructive erase process can be used read the device. In this case, if the cell is in an "off" state, a write pulse will produce an ion current spike as region 160 forms, whereas a device that already includes a region 160 will not produce the ion current spike if the process has been limited by, for example, a lack of oxidizable silver.

Figure 7:
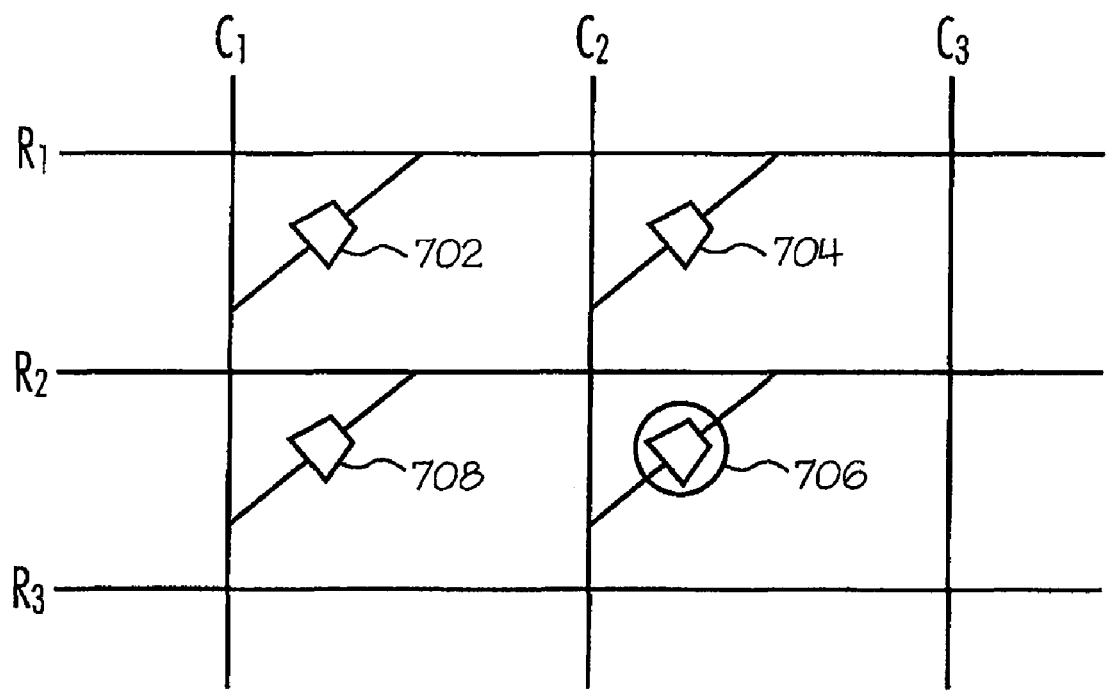
FIGS. 7, 18, 19, and 25-27 illustrate arrays of programmable structures in accordance with the present invention.

FIG. 7 illustrates an array 700 of programmable structure 702-708 that form rows $R_1$-$R_3$ and column $C_1$-$C_3$ of programmable structures. When pulse-mode programming is employed to read and write to array 700, addition diodes and transistors typically used for structure isolation, are not required, so long as regions 160 of the structures are not grown to an extent that they short the structure. A non-bridging region can be obtained by using limited write times, limiting an amount of oxidizable material at the oxidizable electrode that can contribute to region 160 formation, and/or using a resistive region between the electrodes that allows sufficient electron current, but prevents or decreases electrodeposition throughout ion conductor 140.

In array 700, a non-bridging region 160 is grown in the selected structure by, for example, biasing $C_2=+V_t/2$, $R_2=-V_t/2$, where $V_t$ is the reduction/oxidation potential, with all other rows and columns held at or near zero volts, so that no other device in the array sees the full forward write voltage. The resistance remains high after writing as the electrodeposit (region 160) does not bridge the electrodes. The read/erase bias is $C_2=-V_t/2$, $R_2=+V_t/2$ with all others held at zero volts. If the device is in the off state and the erase pulse is applied, very little current will flow through the high resistance electrolyte. If, however, a partial electrodeposit has been formed by a write operation, an erase pulse will produce an ion current spike through $C_2$ and $R_2$ as the electrodeposited metal is oxidized and re-plated on the negative electrode (the oxidizable anode in the write process). This current spike can be sensed and therefore the state of the selected cell can be determined by this process. Note that it is also possible to use full rather than half or partial voltages when the non-selected rows and columns are allowed to float (via the use of tri-state drivers); e.g., $C_2=+V_t$ and $R_2=0$ for write, $C_2=0$ and $R_2=+V_t$ for read/erase.

Control of Operational Parameters

The concentration of conductive material in the ion conductor can be controlled by applying a bias across the programmable device. For example, metal such as silver may be taken out of solution by applying a negative voltage in excess of the reduction potential of the conductive material. Conversely, conductive material may be added to the ion conductor (from one of the electrodes) by applying a bias in excess of the oxidation potential of the material. Thus, for example, if the conductive material concentration is above that desired for a particular device application, the concentration can be reduced by reverse biasing the device to reduce the concentration of the conductive material. Similarly, metal may be added to the solution from the oxidizable electrode by applying a sufficient forward bias. Additionally, it is possible to remove excess metal build up at the indifferent electrode by applying a reverse bias for an extended time or an extended bias over that required to erase the device under normal operating conditions. Control of the conductive material may be accomplished automatically using a suitable microprocessor.

With particular reference to FIGS. 3-5, a partial write or a partial erase caused by a forward or reverse programming pulse of insufficient duration and/or current to introduce enough silver to significantly reduce the resistance of the high-resistance regions will cause additional silver to migrate from the soluble electrode to the high-resistance portions. The conductivity and activation energy in these zones are altered by this excess silver even though the device will appear to be in a high resistance state. The change in activation energy results in higher ion mobility and hence this partial preprogramming results in much faster switching than in a device which had been fully written or erased, which in turn allows appropriately scaled devices to operate at SRAM speeds (in the nanosecond or less range).

In addition, in a written device that has "faded" due to thermal diffusion of the electrodeposited material away from the low resistance pathway, the local excess silver will still promote a lower activation energy but in this case, there is also sufficient silver present that the voltage required to reform the conducting link will be lower than in the case of a normal write. The "reclosure" voltage will be several tens of mV lower than the normal write threshold potential of the system since the silver required to close the link is already in the material and does not have to be released from the oxidizable electrode. This means that a simple "read" operation involving a short pulse below the write threshold potential will be sufficient to regenerate a faded on-state in the device but will be insufficient to disturb a device that has been fully erased (and hence does not have the excess silver). This will allow faded lightly written (low programming current) states to be automatically regenerated by the read operation, thereby extending the effective retention of the devices.

This technique may also be used to form one of the electrodes from material within the ion conductor material. For example, silver from the ion conductor may be plated out to form the oxidizable electrode. This allows the oxidizable electrode to be formed after the device is fully formed and thus mitigates problems associated with conductive material diffusing from the oxidizable electrode during manufacturing of the device.

The threshold voltage of programmable devices may be manipulated in accordance with various embodiments of the present invention. Manipulation of the threshold voltage allows configuration of the programmable devices for desired read and write voltages. In general, as noted above, the threshold voltage depends on, among other things, an amount of conductive material present in the ion conductor, and/or any barrier, and/or, as discussed in more detail below, the presence or absence of an integrated diode.

One way to manipulate the electrodeposition threshold voltage is to manipulate the conductive material dispersed within the ion conductor material. Another technique for manipulating the threshold voltage is to alter an amount of oxidizable material at or near the indifferent electrode. In this case, the oxidizable metal at the cathode can be altered by first forming an electrodeposit at or near the indifferent electrode and then applying a reverse bias sufficient to dissolve a portion of the electrodeposit. The threshold voltage generally goes down as the amount of oxidizable metal at the cathode goes up. For example, in the case where the ion conductor is $Ge_{0.3}Se_{0.7}$ and the soluble electrode is silver, the threshold voltage for electrodeposit formation is about $310 \pm 10$ mV for no predeposited silver to about $90 \pm 10$ mV for a silver saturated electrode. Alternatively, a write process may be used to form a desired electrodeposit at or near the cathode. This electrochemical control of the threshold voltage can be used to heal or regenerate an electrodeposit that has been thermally or electrochemically damaged or redistributed. As an example of how this would work, consider the following:

1. An electrodeposit can be formed in or on the electrolyte using a write voltage that is determined by the Ag concentration near the cathode, e.g., 0.32 V for a silver depleted cathode region.

2. A read voltage below the write voltage may be used to determine the state of the device without disturbing an off device.

3. The electrodeposit is subsequently "damaged" by thermal diffusion (e.g., excessive external device heating) so that the electrodeposit is no longer continuous or localized.

4. The Ag concentration near the cathode will still be higher than in the case of an unwritten or completely erased device as the silver cannot diffuse against the diffusion gradient.

5. The increased cathodic silver results in a reduction of the re-write voltage, e.g., below the read voltage which is chosen not to disturb an off state but to be high enough to "regenerate" failed electrodeposits.

Therefore, a read operation can be used to automatically re-electrodeposit the silver and regenerate the data state stored in the device via the electrodeposited material. This will ensure that the programmable structures effectively retain data for extended periods of time.

Another technique for manipulating threshold voltage includes forming a layer of material between the indifferent electrode and the ion conductor layer, wherein the layer of material is capable of conducting ions and forming an electrodeposit and has a lower concentration of oxidizable material than the ion conductor. Exemplary materials suitable for this layer include undoped or lightly doped chalcogenide materials such as Ge—S or Ge—Se and a variety of other undoped or lightly doped ion conductor materials that have a low solubility level for the oxidizable material. The material layer between the indifferent electrode and the ion conductor reduces oxidizable material build up near the indifferent electrode during processing and operation of the programmable structure.

Figure 8:
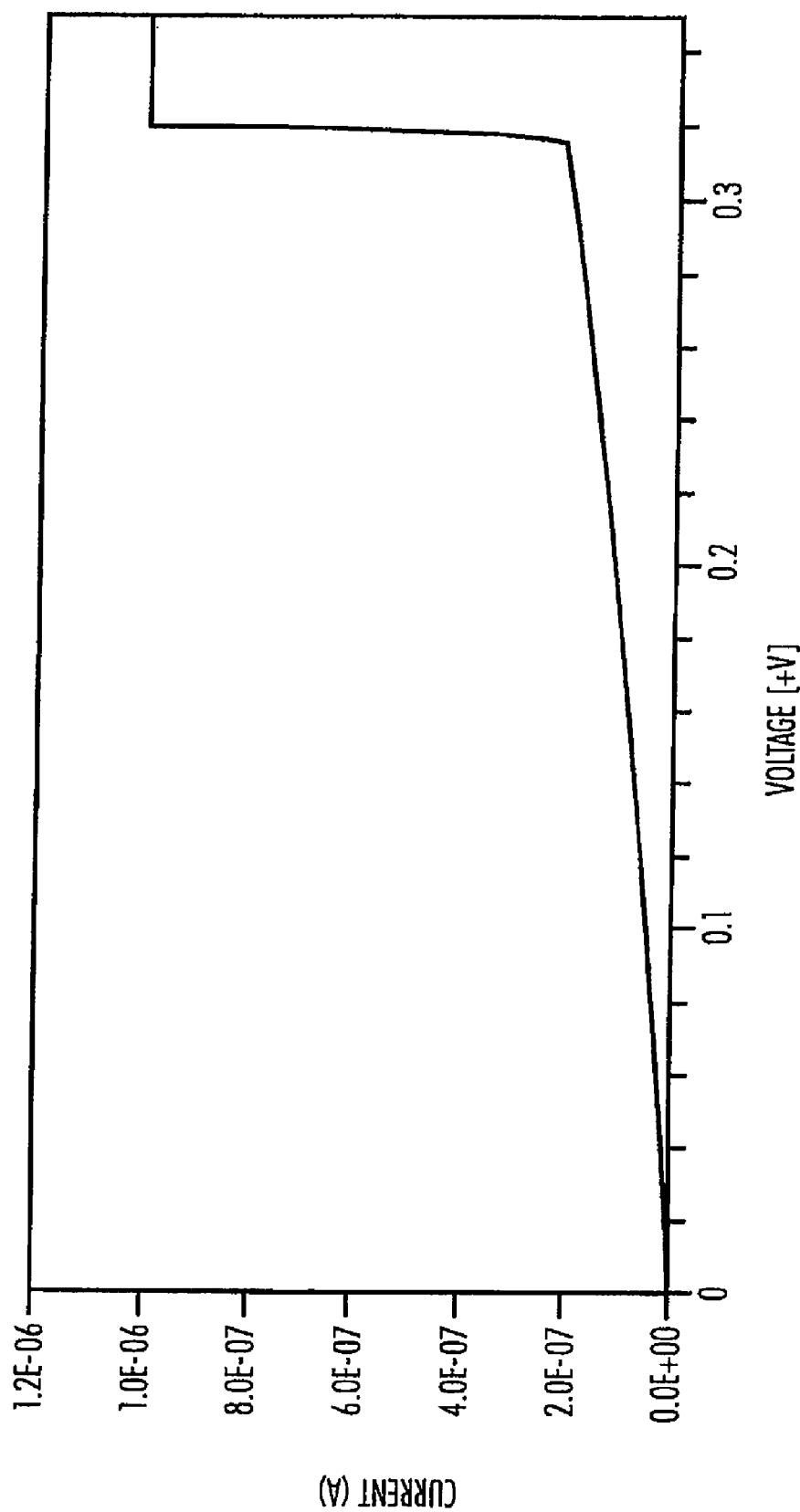
Figure 9:
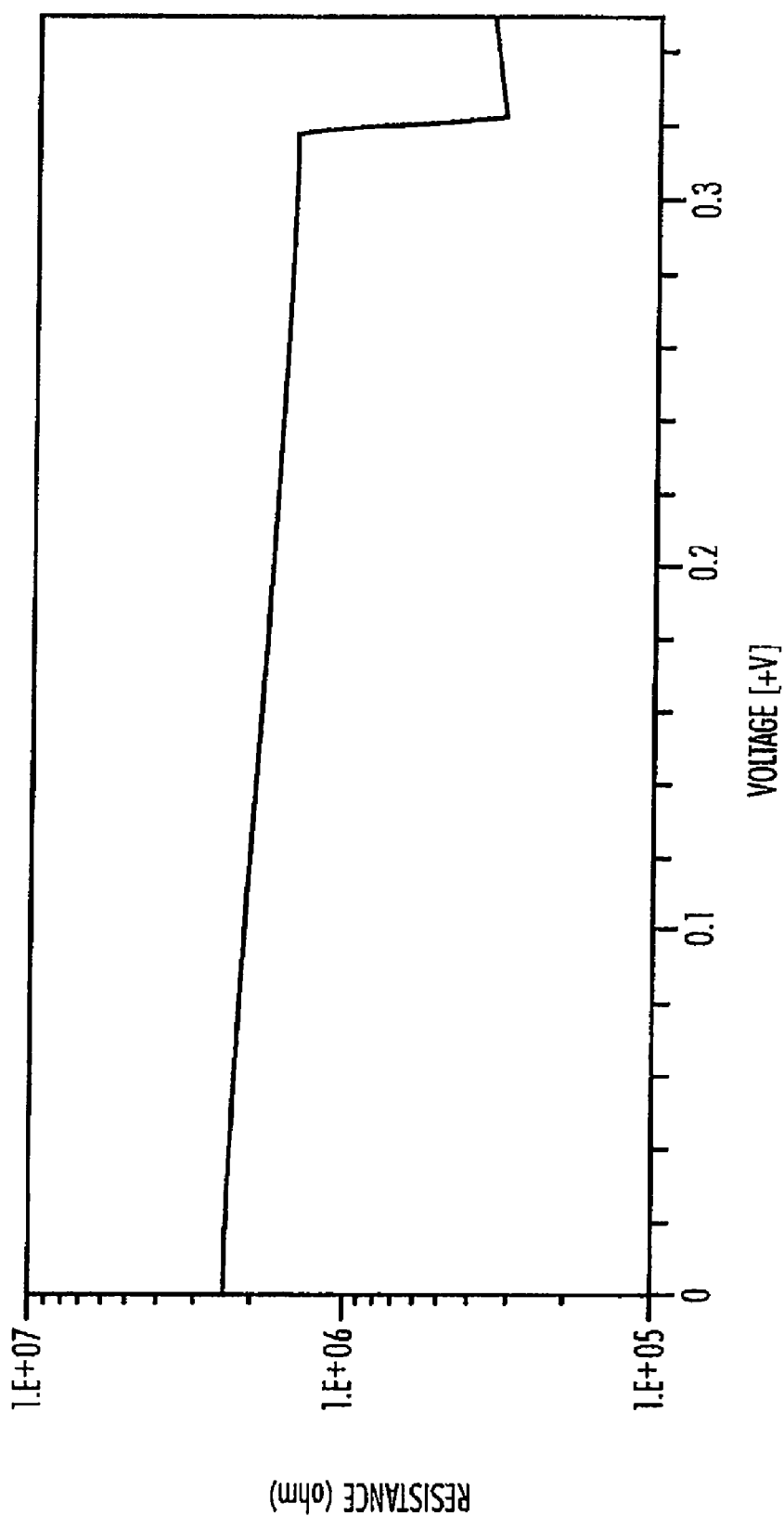

An example of a write operation on a device which includes a silver saturated sulfur-rich Ge—S starting glass and a layer of relatively low silver content, less than 10 nm thick, between the indifferent electrode and the saturated ion conductor is illustrated in FIG. 8 (current vs. voltage for a 1 μA programming current) and FIG. 9 (resistance vs. voltage for a 1 μA programming current). In the illustrated case, the write voltage lies around 320 mV. Note that this layer could be deposited separately from the Ag-rich electrolyte or can be formed, as described above, by stopping the photodiffusion before the oxidazable metal penetrates the entire film thickness.

To mitigate undesired diffusion of an electrodeposit formed during a write process, it may be desirable to saturate the ion conductor with conductive material during a write process, such that the resistance of the structure does not substantially change due to diffusion of conductive material. In the case where the ion conductor comprises germanium selenide doped with silver and the electrodeposit is formed from silver, the approximate minimum "saturation" programming current to maintain electrodeposition until the electrolyte has a uniform silver concentration and corresponding resistance as a function of electrolyte area is given below for a 10 nm thick silver-doped germanium selenide solid electrolyte.

| Area (nm/nm²) | Saturation current (μA) | Resistance (kΩ) |
|---|---|---|
| 1 | 0.3 | 1,000 |
| 10 | 3 | 100 |
| 100 | 30 | 10 |
| 1000 | 300 | 1 |
| 10,000 | 3,000 | 0.1 |

Figure 10:
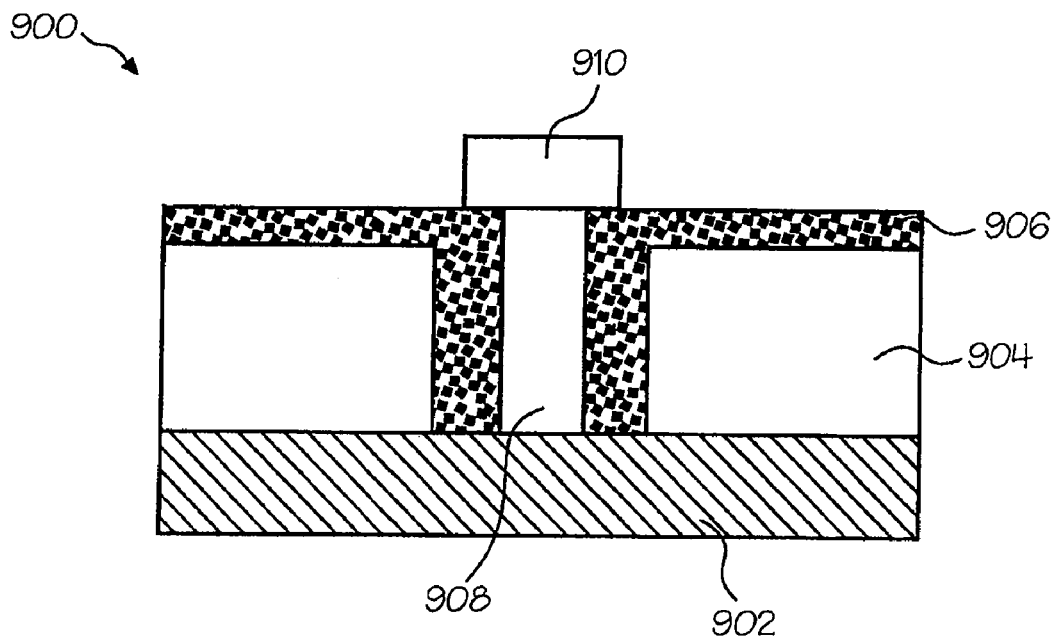
FIGS. 10-14 illustrate programmable structures including barrier layers in accordance with exemplary embodiments of the invention.
Figure 11:
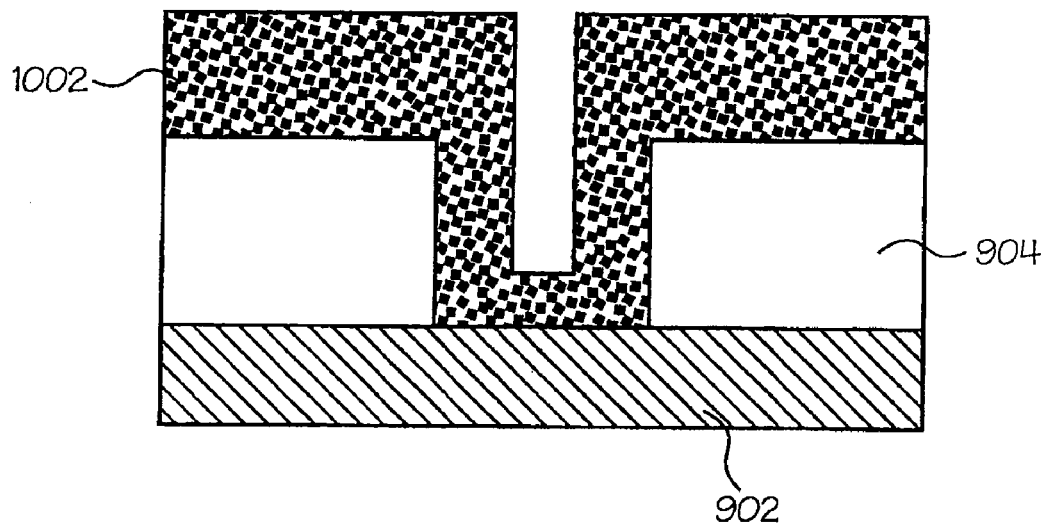

FIGS. 10 and 11 illustrate additional structures, which are configured to mitigate any unwanted diffusion of conductive material within an ion conductor, in accordance with further exemplary embodiments of the present invention. In general, the structures illustrated in FIGS. 10 and 11 include a relatively narrow ion conductor (compared to the height of the ion conductor) surrounded by a material which is less ion conductive than the ion conductor.

Structure 900 includes a first electrode 902, an insulating layer 904, a diffusion barrier 906, an ion conductor 908 and a second electrode 910. Electrodes 902 and 910, insulating layer 904, and ion conductor 908 may be formed of the corresponding materials and using the same techniques described above in connection with FIGS. 1 and 2. The barriers may be configured such that only one "column" of ion conductor material spans between the electrodes or the structures may include a plurality of ion conductor columns that span between the electrodes. In the latter case, the electrodeposition may only occur in one of the columns if the current is appropriately limited. In either case, because the column diameter is relatively small (e.g., less than about 50 nm) the current required to saturate the region is also relatively small (e.g., about 30 μA).

Diffusion barrier 906 can be formed by conformally depositing a barrier material 1002 such as silicon nitride or any of the barrier materials discussed above in connection with layers 155 and 255 and illustrated in FIG. 11 and removing a portion of the barrier material (e.g., using an anisotropic etch) to form barrier 906 illustrated in FIG. 10. Ion conductor 908 can then be formed using deposition and etch or damascene techniques.

Figure 12:
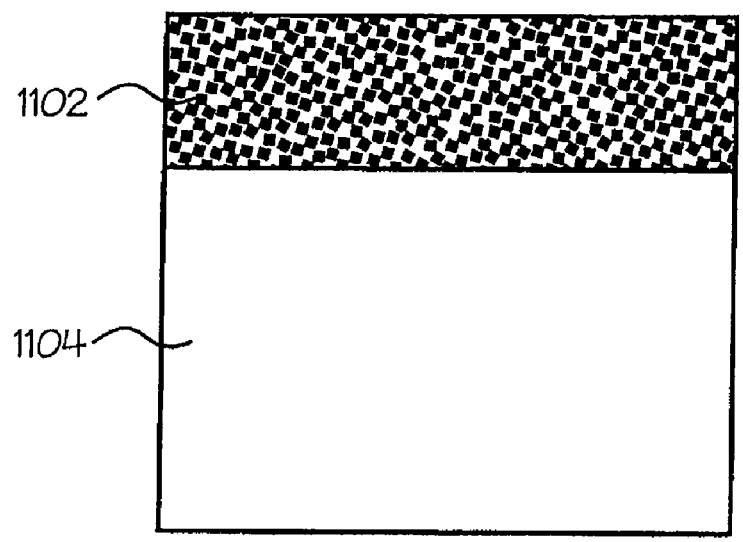
Figure 13:
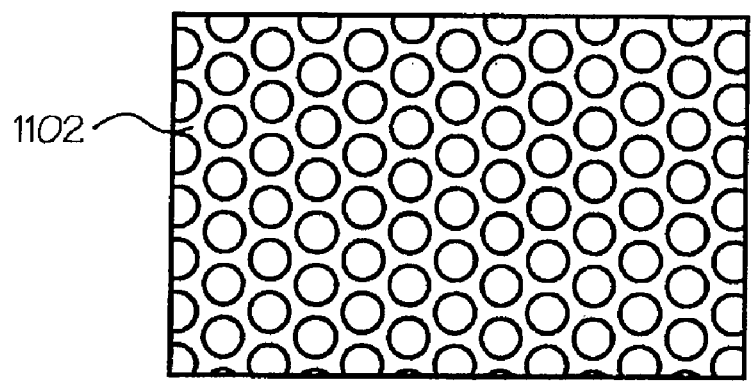

Another technique for forming diffusion barriers is illustrated in FIGS. 12 and 13. In this case, porous barrier material 1102 is formed on a surface of a substrate 1104 and ion conductor material is formed in the porous regions of barrier material 1102. Alternatively, porous material 1102 can be used as an etch mask to etch ion conductor material (using an anisotropic etch) to form columns of ion conductor material. Spaces between to columns are then filled with appropriate barrier materials such as silicon nitride. Electrodes may be formed about one or more columns of ion conductor material as described herein to form programmable devices of the present invention.

Figure 14:
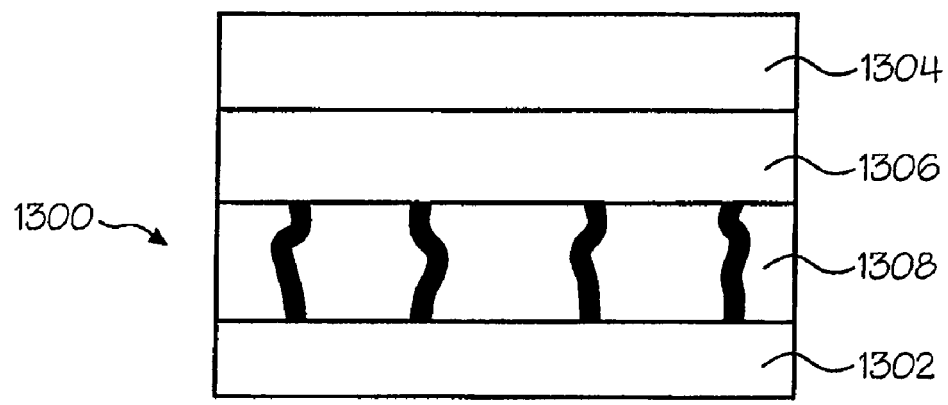

FIG. 14 illustrates yet another structure 1300 suitable for forming diffusion-resistant programmable structures. Structure 1300 includes a first electrode 1302, a second electrode 1304, an ion conductor 1306, and a material layer 1308 that favors electrodeposit growth substantially in only one direction. Electrodes 1302 and 1304 and ion conductor 1306 may be formed of any of the corresponding electrodes and ion conductors described herein. Suitable exemplary materials for material layer 1308 include thin (e.g. a few nm) amorphous films of oxides and nitrides (e.g., $SiO_2$, $GeO_2$, $Si_3N_4$) and semiconductors (Si, Ge) and polycrystalline films of oxides, nitrides, and semiconductors. In accordance with one aspect of this embodiment of the invention, layer 1308 is formed between ion conductor 1306 and the indifferent electrode.

As noted above, in accordance with yet another embodiment of the invention, multiple bits of data may be stored within a single programmable structure by controlling a size of region 160 which is formed during a write process. A size of region 160 that forms during a write process depends on a number of coulombs or charge supplied to the structure during the write process, and may be controlled by using a current limit power source. In this case, a resistance of a programmable structure is governed by Equation 1, where $R_{on}$ is the "on" state resistance, $V_T$ is the threshold voltage for electrodeposition, and $I_{LIM}$ is the maximum current allowed to flow during the write operation.

$$R_{on} = \frac{V_T}{I_{LIM}} \quad \text{Equation 1}$$

In practice, the limitation to the amount of information stored in each cell will depend on how stable each of the resistance states is with time. For example, if a structure with a programmed resistance range of about 3.5 kΩ and a resistance drift over a specified time for each state is about ±250Ω, about 7 equally sized bands of resistance (7 states) could be formed, allowing 3 bits of data to be stored within a single structure. In the limit, for near zero drift in resistance in a specified time limit, information could be stored as a continuum of states, i.e., in analog form.

Figure 15:
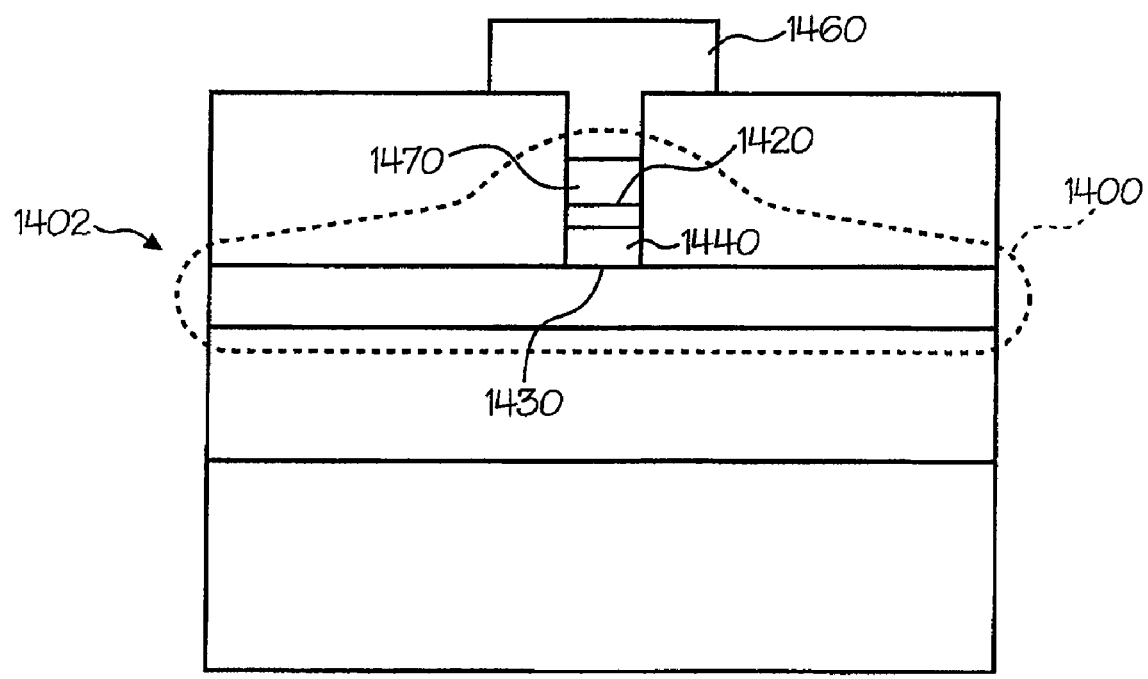
FIG. 15 is a cross-sectional illustration of a programmable structure in accordance with yet another embodiment of the present invention.

A portion of an integrated circuit 1402, including a programmable structure 1400, configured to provide additional isolation from electronic components is illustrated in FIG. 15. Structure 1400 includes electrodes 1420 and 1430, an ion conductor 1440, a contact 1460, and an amorphous silicon diode 1470, such as a Schottky or p-n junction diode, formed between contact 1460 and electrode 1420. Rows and columns of programmable structures 1400 may be fabricated into a high density configuration to provide extremely large storage densities suitable for memory circuits. In general, the maximum storage density of memory devices is limited by the size and complexity of the column and row decoder circuitry. However, a programmable structure storage stack can be suitably fabricated overlying an integrated circuit with the entire semiconductor chip area dedicated to row/column decode, sense amplifiers, and data management circuitry (not shown) since structure 1400 need not use any substrate real estate. In this manner, storage densities of many gigabits per square centimeter can be attained using programmable structures of the present invention. Utilized in this manner, the programmable structure is essentially an additive technology that adds capability and functionality to existing semiconductor integrated circuit technology.

Figure 16:
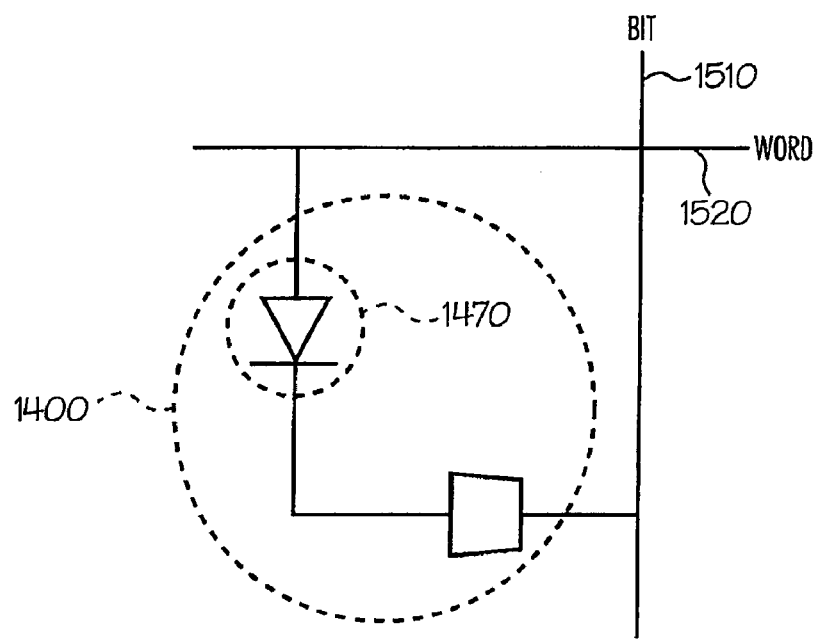
FIGS. 16 and 17 are schematic illustrations of a portion of a memory device in accordance with an exemplary embodiment of the present invention.
Figure 17:
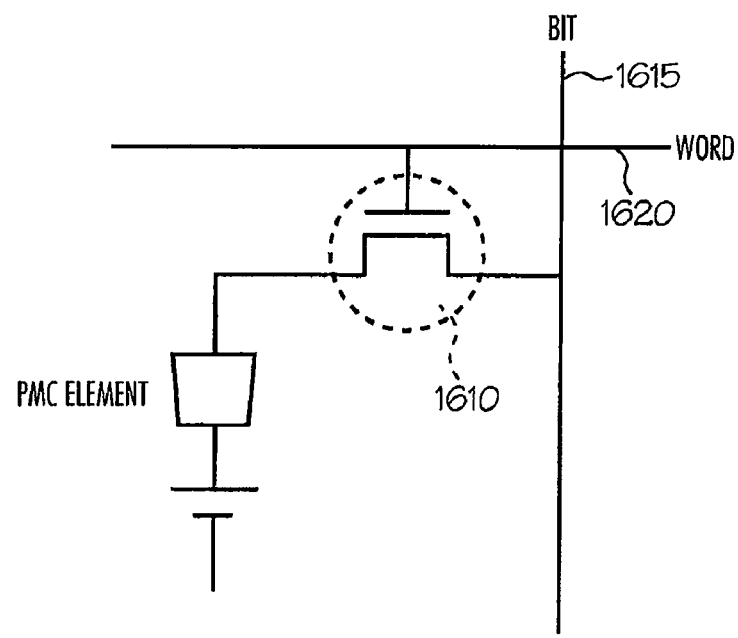

FIG. 16 schematically illustrates a portion of a memory device including structure 1400 having an isolating p-n junction 1470 at an intersection of a bit line 1510 and a word line 1520 of a memory circuit. FIG. 17 illustrates an alternative isolation scheme employing a transistor 1610 interposed between an electrode and a contact of a programmable structure located at an intersection of a bit line 1610 and a word line 1620 of a memory device.

Figure 18:
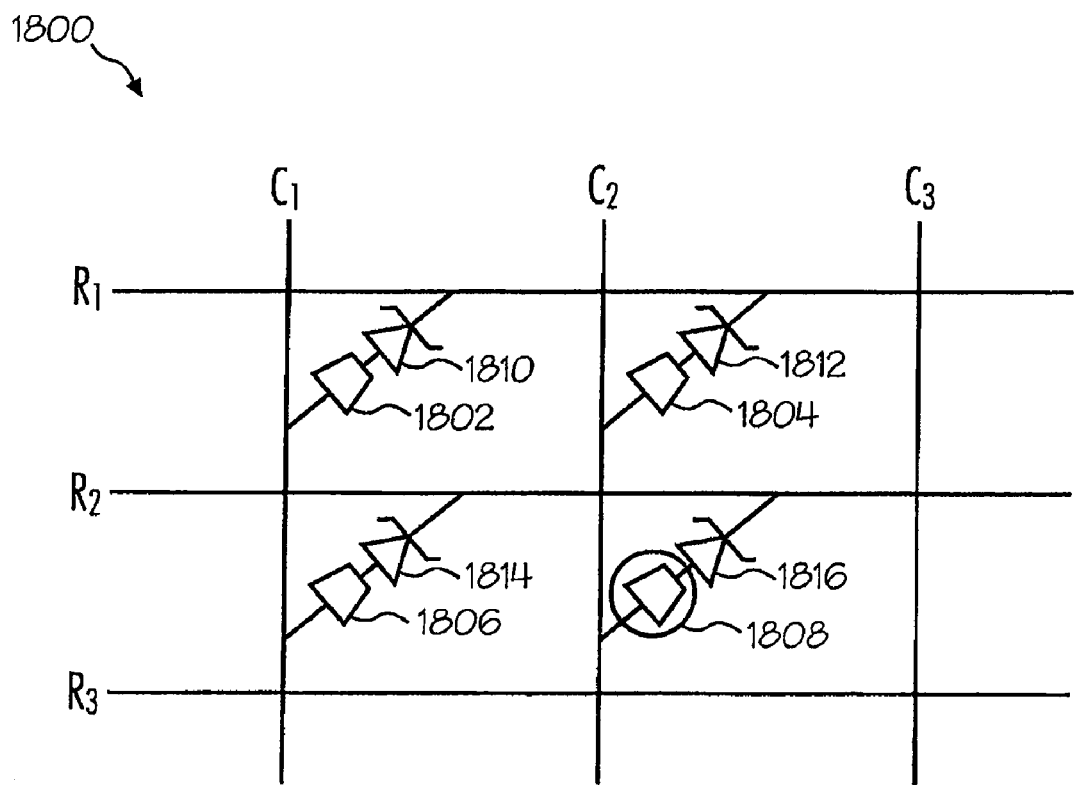

FIG. 18 illustrates another array 1800, including programmable structures 1802-1808 and Zener diodes (preferably with low reverse turn on voltage) 1810-1816, in accordance with the present invention. A selected cell is written by, for example, making $C_2=+V_w/2$, $R_2=-V_w/2$ (where $V_w$ is greater than or equal to the write threshold of the device) with all other rows and columns held at zero volts so that no other device in the array sees the full forward write voltage. To erase the selected cell, $C_2$ is set to $-V_E/2$, $R_2=+V_E/2$ (where $V_E$ is greater than or equal to the reverse turn-on voltage of the Zener diode plus the erase threshold of the device) with all other rows and columns again held at zero volts. The selected device is read using much the same approach by making $C_2=+V_R/2$, $R_2=-V_R/2$ (where $V_R$ is chosen to be below the write threshold) with all other rows and columns held at zero volts. It is also possible to use full rather than half voltages when the non-selected rows and columns are allowed to float (via the use of tri-state drivers); e.g., $C_2=+V_w$ and $R_2=0$ for write, $C_2=0$ and $R_2=+V_E$ for erase, and $C_2=+V_R$ and $R_2=0$ for read.

Figure 19:
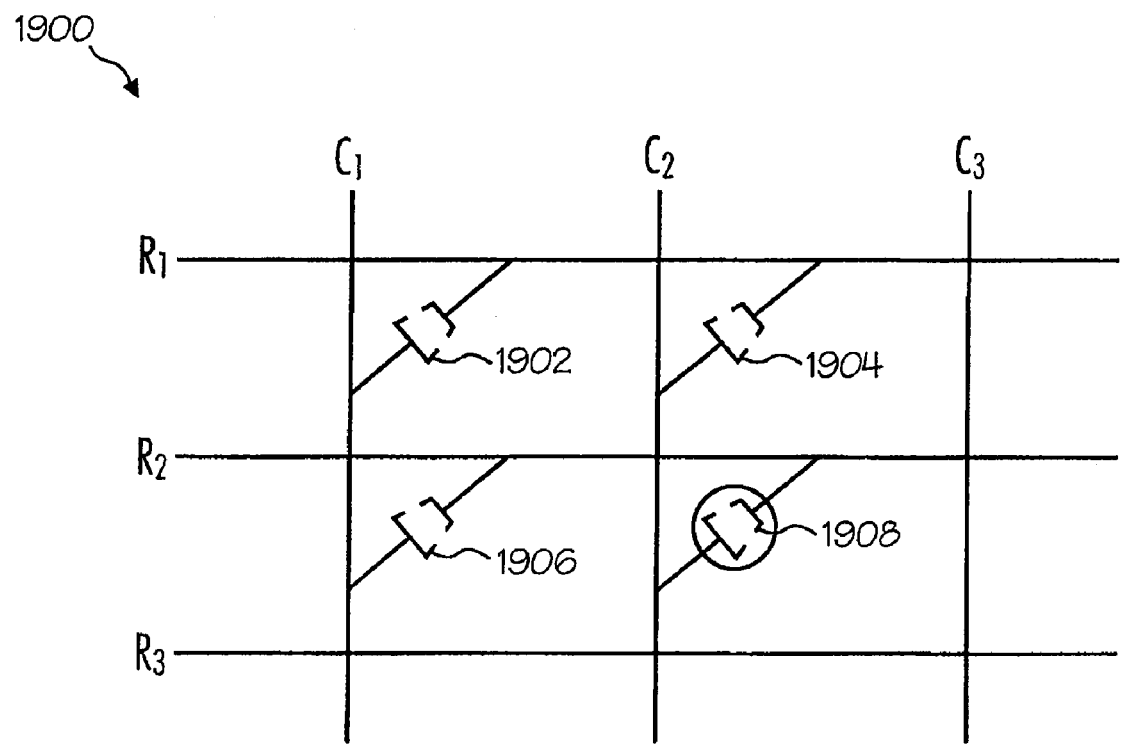

FIG. 19 illustrates another array 1900 that uses structures 1902-1908, which store information in the form of a change in capacitance rather than a change in resistance. This may be accomplished by the growth of a non-shorting electrodeposit, i.e., one that does not extend all the way from anode to cathode. A non-shorting electrodeposit can be the result of a reduced charge write pulse which produces a deposit that only extends a short distance from the cathode. A dielectric/tunnel barrier that allows sufficient electron current to flow into the electrolyte but which prevents electrodeposition across the structure can also be used to prevent a shorting electrodeposit from forming. Alternatively, electrodeposit growth across the electrolyte may be limited by providing an appropriate amount of oxidizable silver at the anode for region 160 growth.

The capacitive storage structures 1902-1908 can be placed in an array without diodes or other isolation devices as they will not create shorting paths from one row or column to another. Structures 1902-1908 are programmed in the same way as the diode array described above, but the erase voltage is now just the threshold voltage for dissolution of the electrodeposit.

FIGS. 20-23 illustrate, schematically, another technique for storing information in an array of lateral programmable structures that include an additional sensing electrode. Each structure includes an anode 2002, a cathode 2004, a sense electrode 2006, and a connector 2008. Information is stored as the capacitance of the geometric overlap of the electrodeposit and sense electrode 2006, separated from each other by an appropriate dielectric. In this case, anode 2002 and cathode 2004 in each device are fed by a row and column in the array. Since the electrodes are coplanar in a lateral PMC device, one of the electrodes (e.g., the anode) must be connected to the array by way of a via contact or connector 2008 through the inter-metal dielectric. FIGS. 20-23 each illustrate examples of individual device configuration schematics in which the anode is connected to a level 3 column (sense is level 1) (FIG. 20) or a level 1 column (sense is level 3) (FIG. 22). Configurations illustrated in FIGS. 21 and 23 have the sense line as a level 1 or level 3 offset row (under or over the electrolyte) with the other electrodes configured as before. The cathode is a level 2 row in all cases (the dielectrics are not shown and the devices are not drawn to scale).

Figure 20:
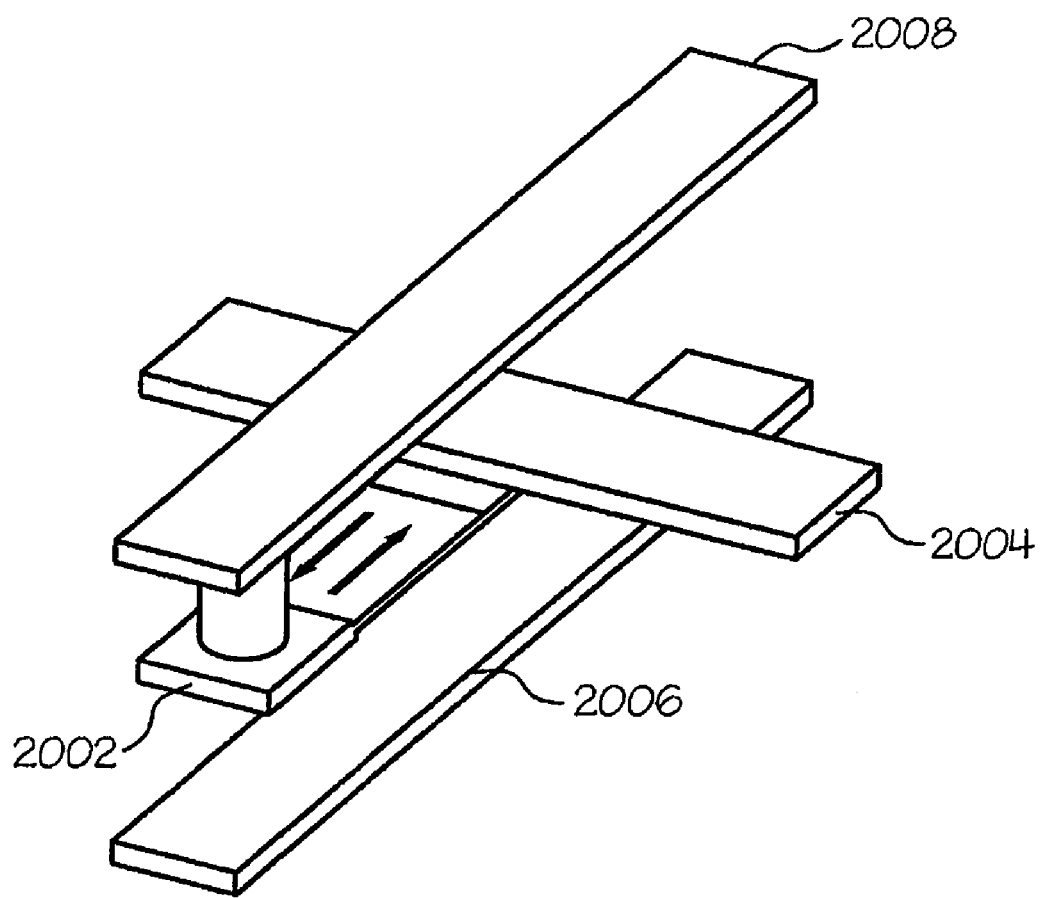
Figure 23:
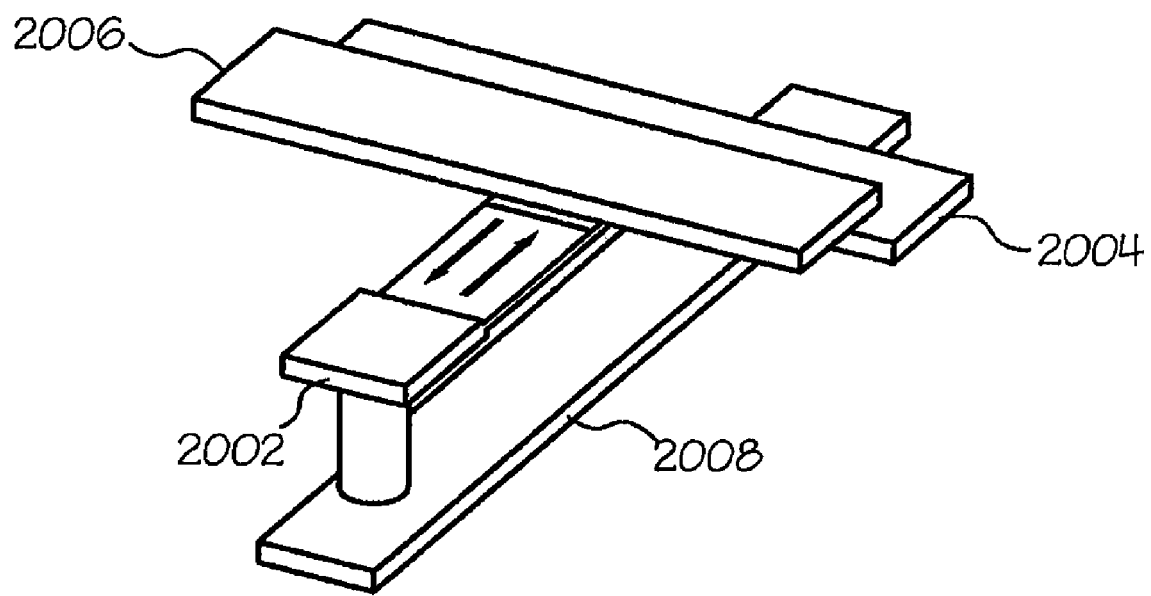
Figure 24:
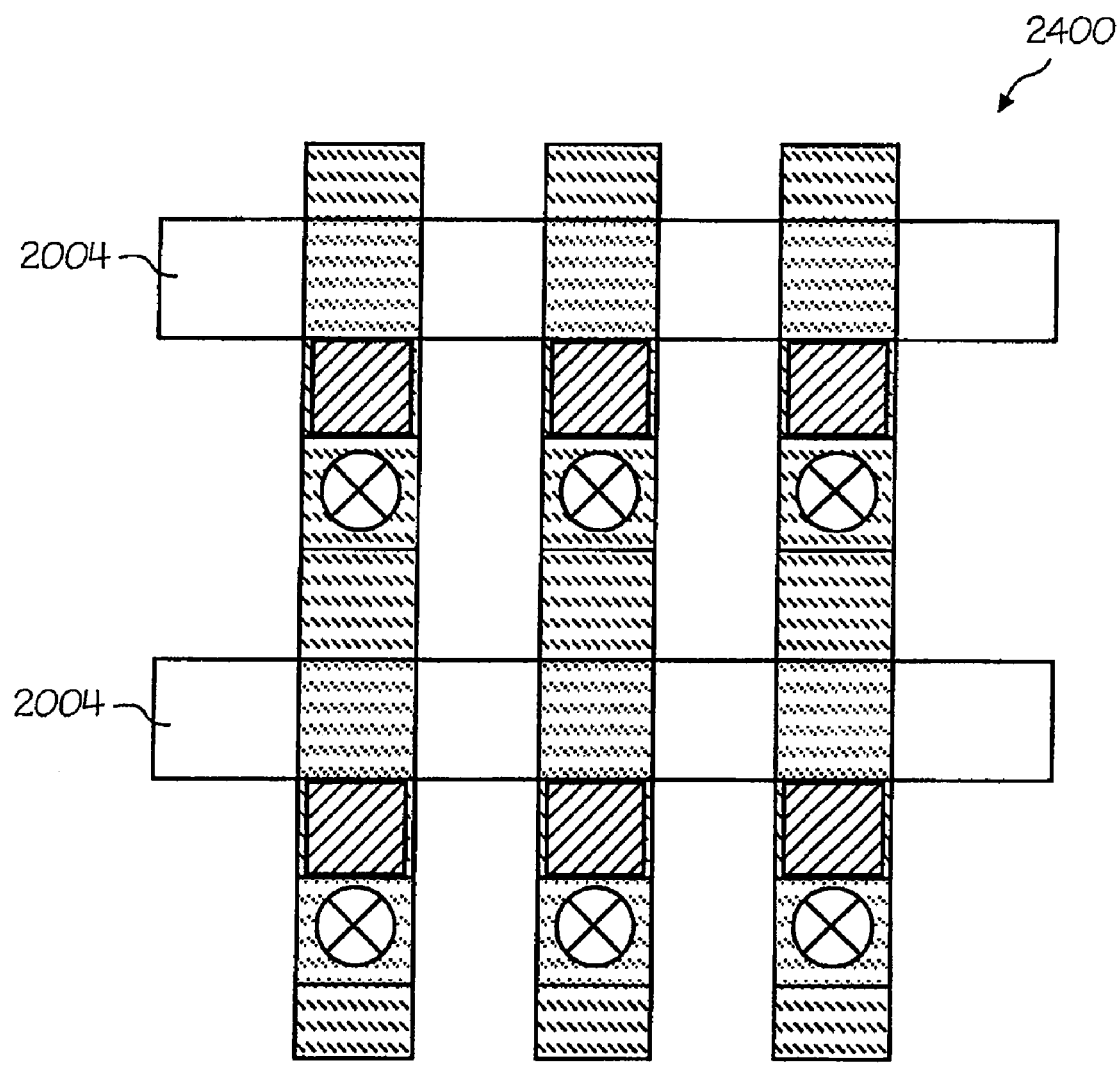
Figure 25:
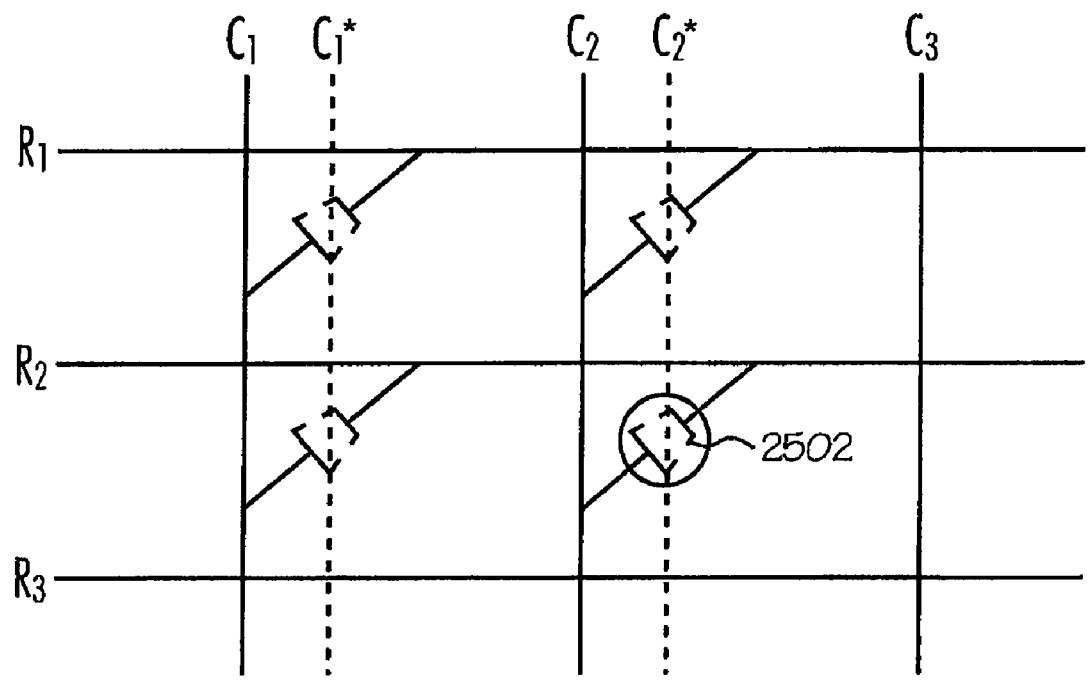

FIGS. 24 and 25 illustrate another array 2400 formed using the configurations presented in either FIG. 20 or FIG. 22. As illustrate in FIG. 25, a selected cell 2502 is written and erased via $R_2$ and $C_2$ as described above, but is read by detecting a capacitance between $R_2$ and $C_2^*$.

Another approach to forming a passive programmable array is to form an incomplete or otherwise high resistance electrodeposit to produce an "on" state with a resistance which is high enough to prevent sneak paths. This may be achieved using a two terminal structure illustrated in FIG. 19 or three terminal structure illustrated in FIGS. 20-23.

Figure 26:
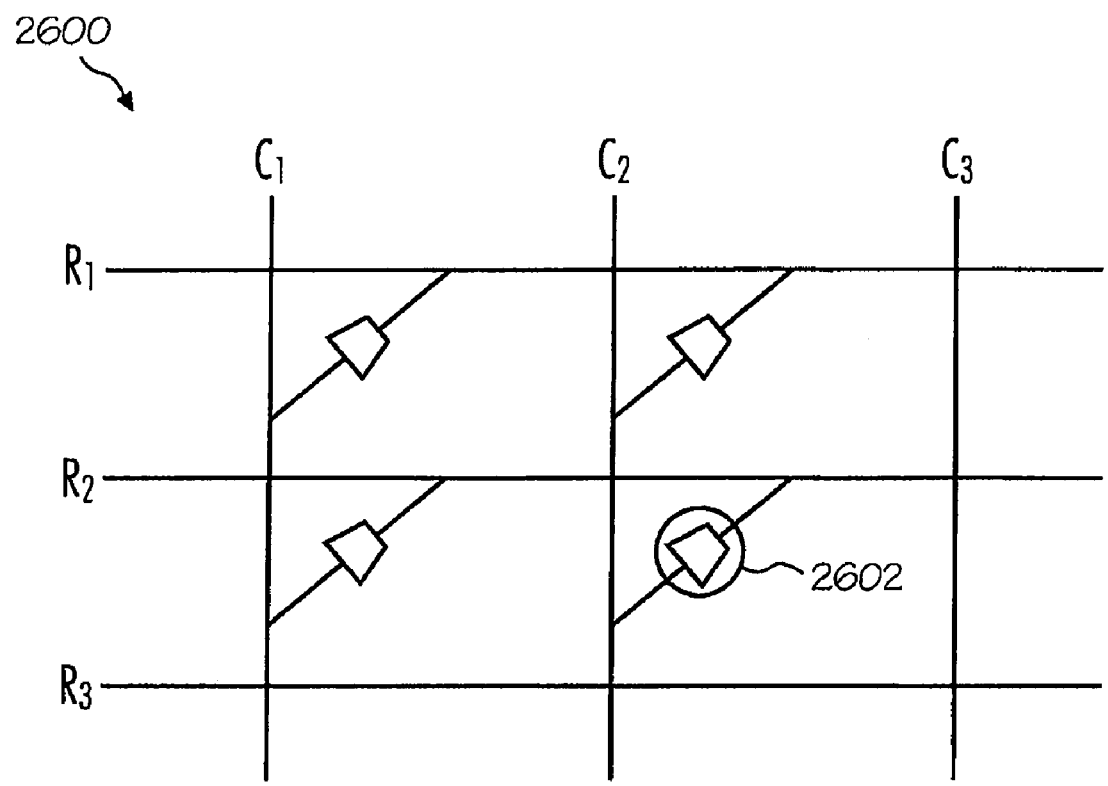

FIG. 26 illustrates a two-terminal structure array 2600 in which a partial electrodeposit is grown the same way as discussed above, e.g., $C_2=+V_w/2$, $R_2=-V_w/2$ with limited write time, limited oxidizable metal, or with a resistive barrier between the electrodes (e.g., at the cathode). The resistance remains high after writing as the electrodeposit does not bridge the electrodes. This relatively high resistance state can be differentiated from the full off state as the current flow through the device will be altered by the presence of the electrodeposit. One way to detect the presence of a partial electrodeposit is to destructively read the device using an erase pulse, as described above Alternatively, a write operation can be similarly used to destructively read the state.

Figure 27:
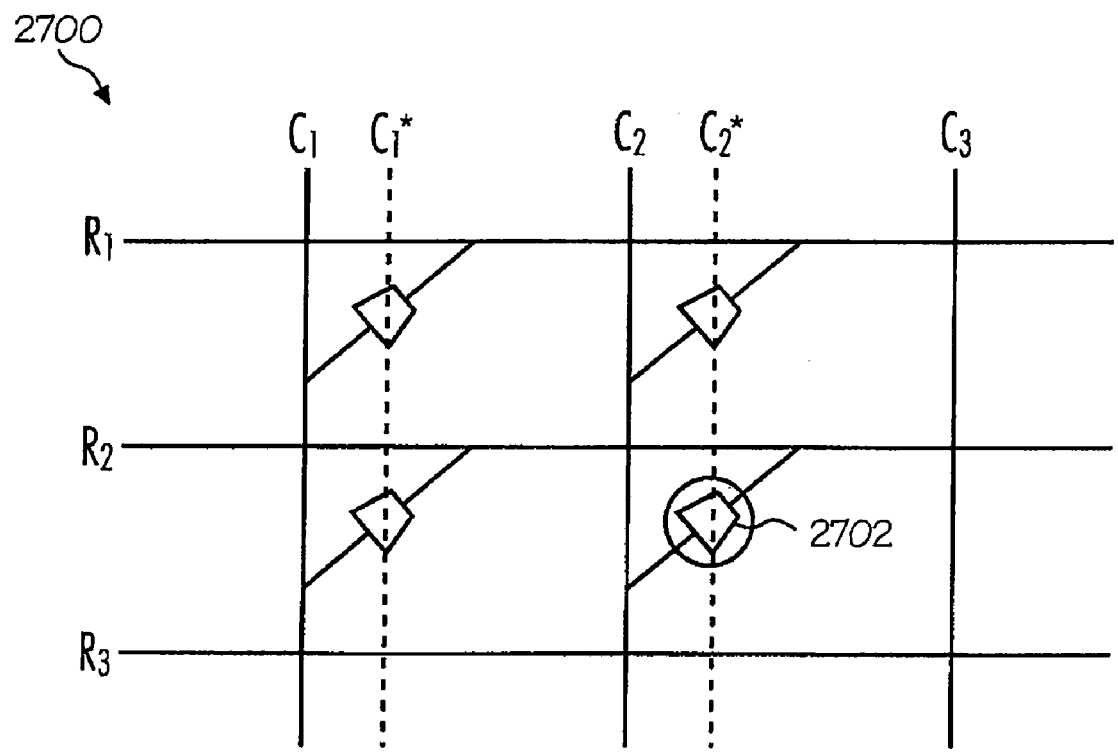

FIG. 27 illustrates a three-terminal structure 2700 in accordance with yet another embodiment of the invention. Structure 2700 includes a resistive material such that a current path exists between the electrodeposit and the sense electrode. In this case, a partial electrodeposit is grown as described above, and information is stored as a change in resistance due to the geometric overlap of the electrodeposit and the sense electrode. As illustrated in FIG. 27, a selected cell 2702 is written via $R_2$ and $C_2$ as before and the state (resistance) of the cell is sensed via $R_2$ and $C_2^*$. The resistivity of the material between the electrodeposit and the sense electrode must be high enough to prevent low resistance pathways forming between the sense lines.

Figure 28:
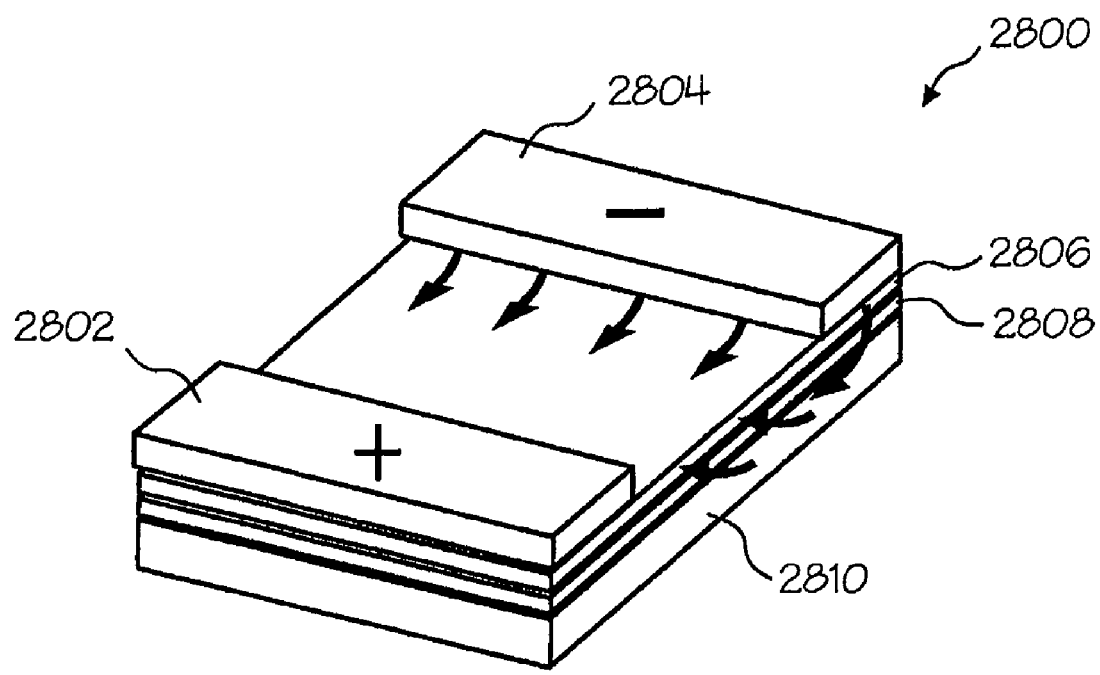
FIGS. 28-30 are illustrations of programmable structures in accordance with additional embodiments of the invention.

FIG. 28 illustrates a lateral programmable structure 2800, including a first electrode 2802, a second electrode 2804, an ion conductor 2806, and a conducting layer 2808, formed overlying a substrate 2810.

Ion conductor 2806 may be formed by, for example, photodissolving silver into a Ch-rich Ge—Ch glass, where Ch is S or Se, until the resulting ternary is "saturated" with the metal. In this case, the silver significantly modifies the transport properties of the material and the availability of mobile silver throughout the electrolyte is high. When an ion current flows, it is thought that the silver moves as a coordinated motion of ions—essentially a "ripple effect" analogous to a shift register in electronics. In order to be reduced, the ionic silver must combine with the electron current from the cathode which means that the ions nearest the cathode will be reduced first and the conducting electrodeposit so formed will become the source of cathodic electrons during subsequent reduction. In this way, the growing electrodeposit "harvests" ions from the electrolyte as it grows out from the cathode, supplying electrons for the reduction of the local silver near its boundaries and thereby further extending the electrodeposit across the electrolyte. This process will continue until the source of oxidizable silver is exhausted or until the resistance between the electrodes falls to a point where the voltage drop is below the reduction/oxidation potential. To join the growing electrodeposit, the individual ions only have to move at most a few nm in the electrolyte. Those which move and are reduced are replaced in the electrolyte via the coordinated ion motion from the anode so that the total quantity of metal in the electrolyte is the original amount plus that added due to the ion flux. Accordingly, limiting factors for electrodeposition rate include ion mobility, ion displacement length, and supply of electrons to the reduction area. Because of the short distances involved in the ion transport and the considerable ion mobility at high field, the electron current is likely to be the main factor affecting the rate of electrodeposition, particularly in long lateral devices. In such devices, since the electrolyte is typically formed as a thin film and has a relatively high resistivity, the series resistance will tend to be very large. For example, a 10 nm thick 100 $\Omega\cdot$cm film will have a sheet resistance of about $10^8$ $\Omega$/square so that a 1V bias will initially only force 10 nA in a square geometry device element which corresponds to about $6.25\times10^{10}$ electrons per second. If it is assumed that this is the maximum rate at which ions can be reduced in this case and that it stays constant during electrodeposition, an electrodeposit with an effective area of about $10\times10$ $\mu m^2$ and a 1 nm thickness would take around 93 msec to form. If a desire is to produce a uniform electrodeposit over an area such as that described above, it will be unlikely to be realized due to the elongated or dendritic growth that tends to occur; since the growing electrodeposit is the main source of electrons once growth is initiated, all deposition takes place at its boundaries and particularly at its tip, further elongating the structure.

Accordingly, in accordance with one embodiment of the invention, to improve both speed and electrodeposit coverage, an underlying conductor 2808 is provided to distribute current and even the lateral electric field as shown in FIG. 28.

In this example, the electrolyte and its coplanar anode and cathode are formed on a thin high resistance layer that separates the electrolyte from a parallel conductor. The resistive layer parameters are chosen to prevent the electrodes from being shorted together by the conducting layer but also to allow some current to flow to the conductor so that it can be redistributed in the electrolyte. This additional source of current perpendicular to the plane of the electrolyte means that the current is no longer limited by the lateral resistance of the electrolyte and so the electrodeposition can proceed orders of magnitude faster. Also, since the growing electrodeposit is no longer the only source of electrons, the electrodeposition effect may be much more two dimensional, allowing better coverage of the surface.

Figure 29:
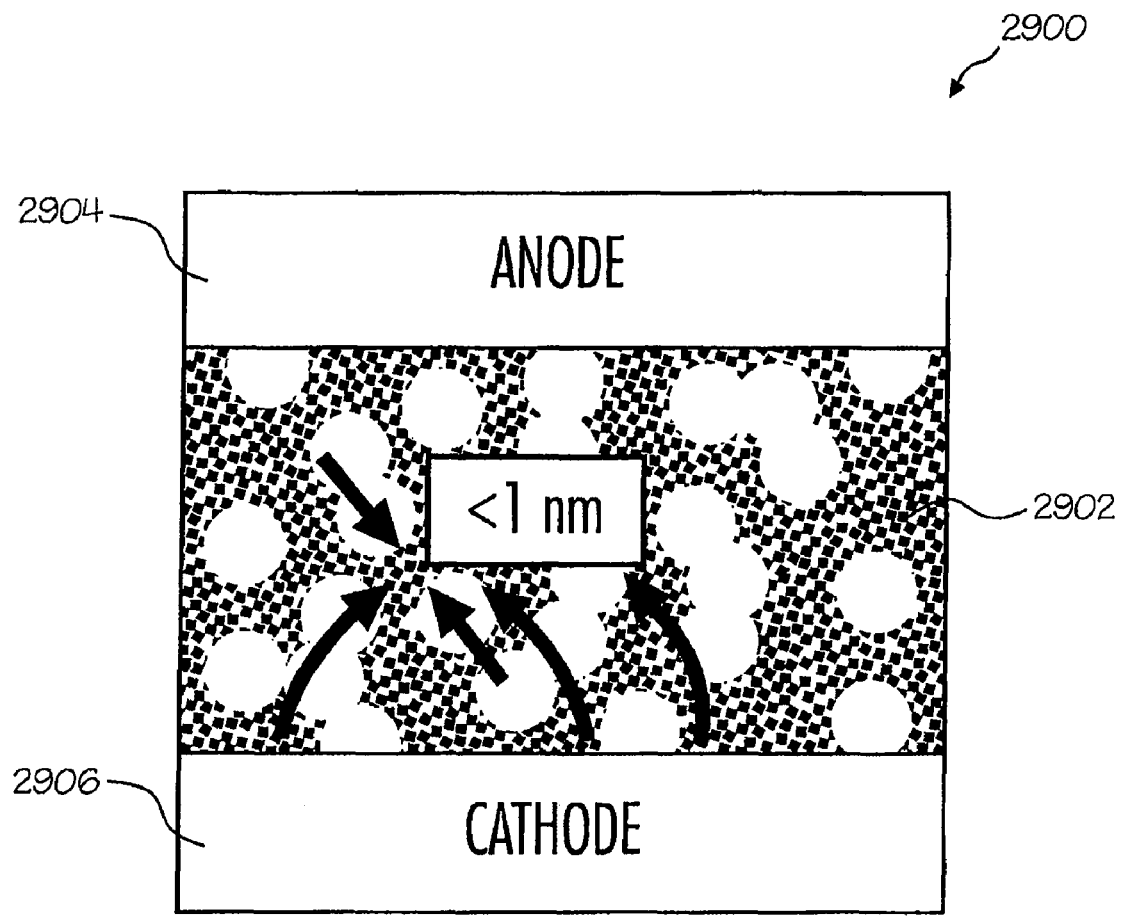

Note that this approach can also be used with vertical devices, such as structure 2900, illustrated in FIG. 29. In this case the electrons will flow through the volume of ion conductor 2902 interposed between a first electrode 2904 and a second electrode 2906 via the parallel high conductivity regions illustrated by the arrows.

Figure 30:
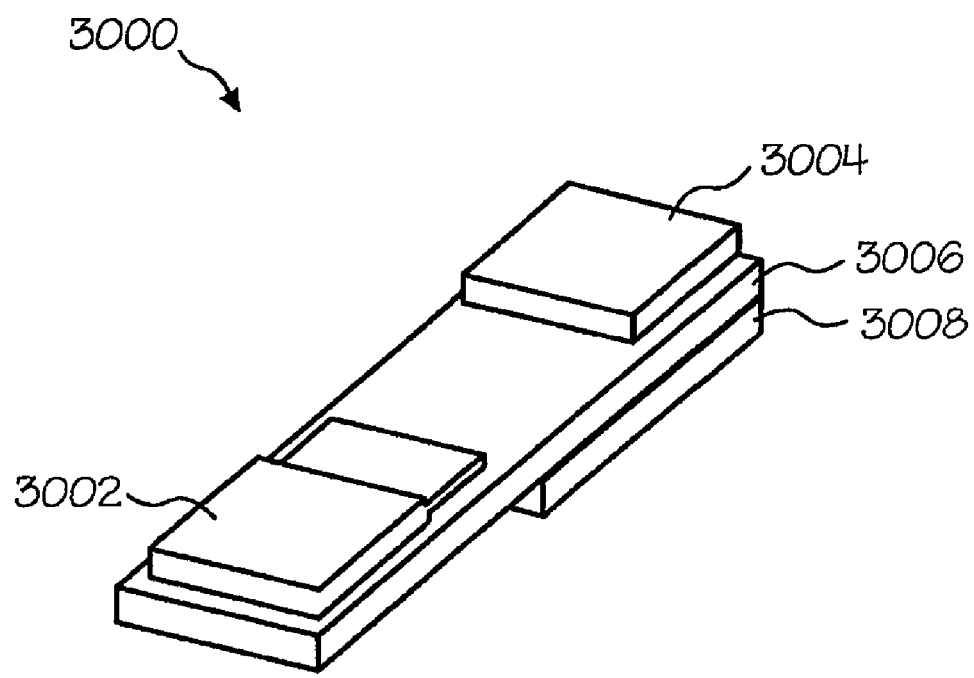

FIG. 30 illustrates a structure 3000, including electrodes 3002, 3004, ion conductor 3006, and a parallel conducting layer 3008. Electrode 3008 is configured to facilitate a partial electrodeposit which only forms in or on part of the ion conductor. This may be achieved by having parallel conductor 3008 extending only part of the way from the cathode, as illustrated. If this electrode is connected to the cathode (or to a separate supply of electrons), it will facilitate rapid and 2-dimensional growth up to the point on the electrolyte where it ends. Beyond this point, the growth will be fed mostly by electrons from the surface electrodeposit (now the cathode) and hence it will slow down. This way, we can grow only a partial 2-dimensional metal structure. A non-bridging electrodeposit can also be attained in lateral devices or vertical devices with thick electrolyte by using the lowest possible write voltage, i.e., a few mV above the reduction/oxidation potential, to keep the writing field low.

As noted above, in accordance with various embodiments of the invention, a programmable structure includes a diode that is integrally formed with the programmable structure, such that a portion of the structure forms at least part of a diode and/or exhibits rectifying properties. Forming a diode integrally with the programmable structure may be desirable, because it provides additional isolation to the programmable structures using minimal feature size of the device (e.g., $4F^2$, where F is the minimal feature size of the structure or device). Because of the rectifying properties of the diode, the integrated diode can be used to reduce cross talk between structures that may otherwise occur through current leakage paths.

Figure 32:
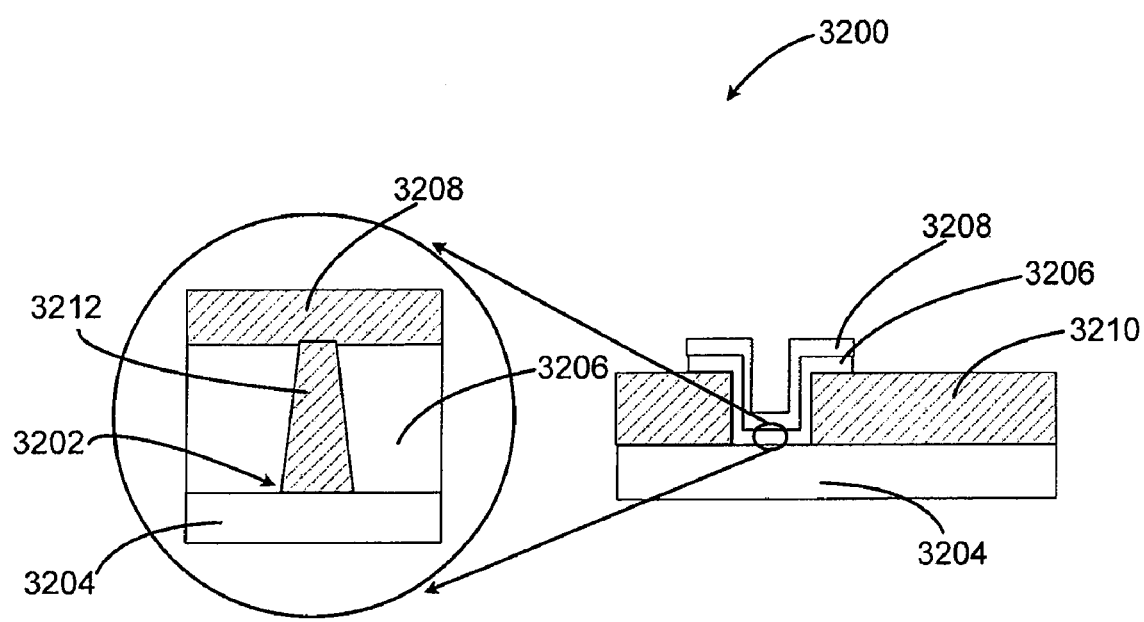
FIG. 32 illustrates a programmable structure including an integrated diode in accordance with exemplary embodiments of the invention.

FIG. 32 illustrates a programmable structure 3200, including an integrated diode 3202. Structure 3200 is similar to structures 100, 200, 1400 described above and may use any of the corresponding materials that are capable of forming an integral diode within the structure. Similarly, the programmable structures with integrated diodes may be included in any of the configurations (e.g., vertical or horizontal) noted above and may include any of the barrier layers, fillers, and the like noted above in connection with other programmable structures.

Structures 3200 may be used in a variety of applications and are particularly well suited for crossbar architecture, where a programmable structure is between a row and a column of an array (as discussed above in accordance with other exemplary embodiments). Structures 3200 exhibit relatively high threshold voltages for a write operation, exhibit relatively low leakage currents, and require relatively high erase voltages compared to similar programmable structures formed without an integrated diode.

In accordance with one example of the invention, structure 3200 includes a first electrode 3204, formed of, e.g., a doped semiconductor material, ion conductor 3206, second electrode 3208, contact 3210, and a contact to second electrode 3208 (not illustrated). Ion conductor 3206, second electrode (e.g., electrode 3208), and contact 3210 may be formed of any materials described above in connection with ion conductors, soluble or oxidizable electrodes, and contacts, respectively. In accordance with exemplary embodiments of the invention, inert electrode (e.g., electrode 3204) is formed of a material (e.g., the doped semiconductor material) that is capable of forming a diode with ion conductor 3206 or a conductive region 3212 that forms within ion conductor 3206 during a write operation. By way of example, diode 3202 may form as an electrodeposit or conductive region 3212 forms, creating a conductor (conductive region)/semiconductor junction diode. In this case, diode 3202 includes the interface between doped semiconductor electrode 3204 and conductive region 3212. When the inert electrode is formed of doped semiconductor material, the properties (e.g., breakdown or threshold voltage for an erase process, write threshold voltage, and leakage current) of structure 3200 may depend on the doping level of the semiconductor material, which may range from, for example, about $10^{14}/cm^3$ to about $10^{19}/cm^3$ or about $5 \times 10^{14}/cm^3$ to about $10^{18}/cm^3$.

Diode 3202 may be any suitable type of rectifying device, such as a Zener diode, a Schottky diode, and the like. However, in general, soft breakdown diodes may be desirable when it is desired to be able erase the device.

Figure 33:
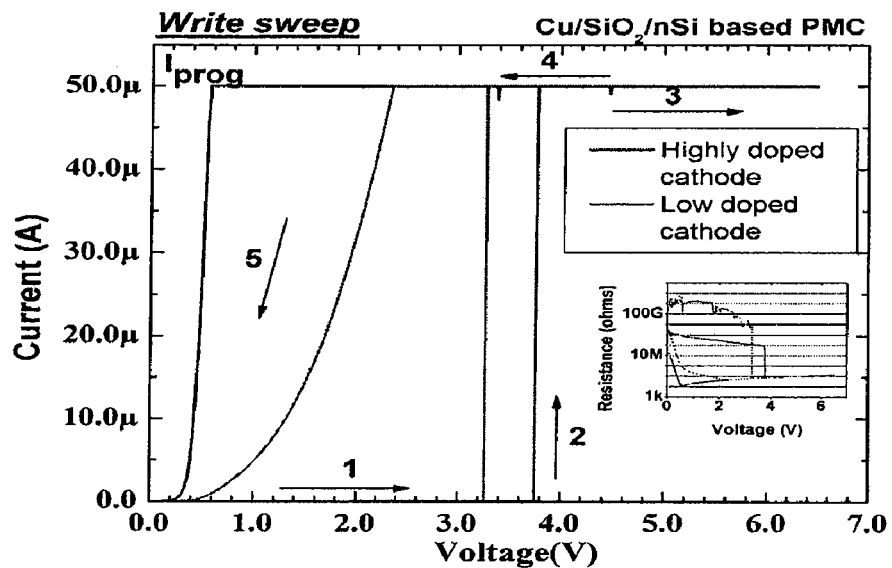
FIGS. 33 and 34 illustrate write and erase programming of programmable structures including an integrated diode in accordance with exemplary embodiments of the invention.
Figure 34:
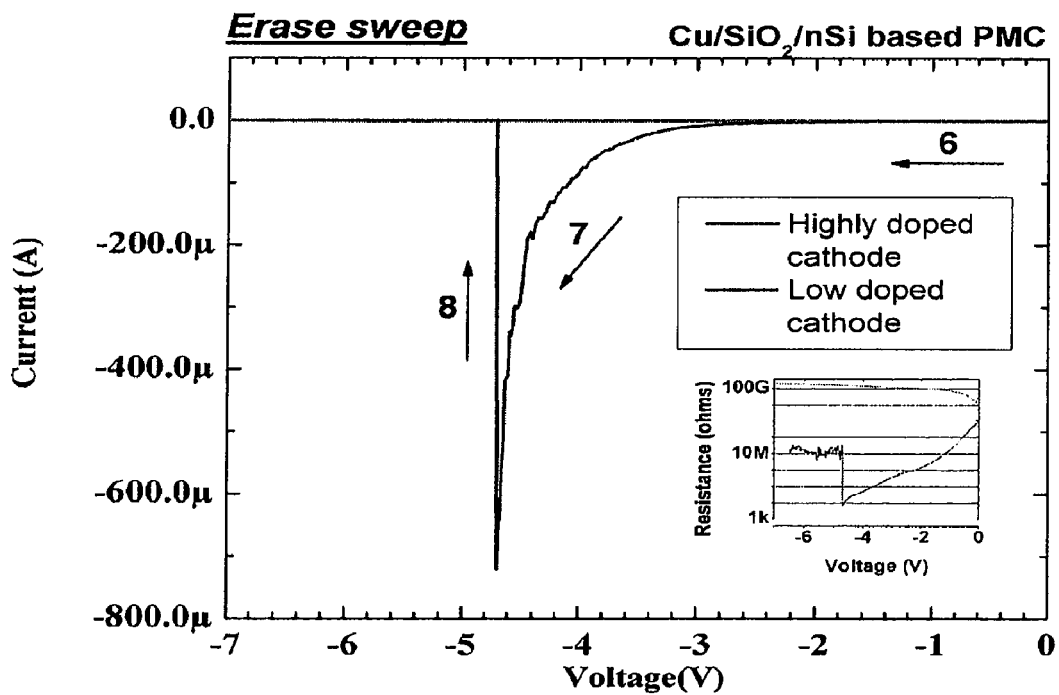

FIGS. 33 and 34 respectfully illustrate write and erase characteristics for exemplary programmable structures having integrated diodes. In the illustrated examples, the structures include a doped silicon electrode 3204, a copper-doped $SiO_x$ ion conductor 3206 (about 15 nm thick and formed by diffusing copper into an approximately 15 nm thick film of deposited $SiO_x$ at about 660° C. for about 15 minutes), a copper electrode 3208, and an aluminum contact 3210. One structure was formed having a $10^{18}/cm^3$ p-doped, n-type silicon electrode 3204 (illustrated as highly-doped cathode) and the other structure was formed having a $5 \times 10^{14}/cm^3$ p-doped, n-type silicon electrode 3204 (illustrated as low doped cathode). Programmable structures with silver-doped $SiO_x$ may be similarly formed in accordance with additional examples of exemplary embodiments.

In FIG. 33, both devices are initially in their high-resistance state in region 1 of the WRITE sweep. As shown in the inset, $R_{off}$ for the highly doped case is in excess of $10^8 \Omega$ and the low doped device has $R_{off}$ above $10^{10} \Omega$ (which, in the illustrated case, is at the limit of the measurement apparatus). The switching to the low-resistance state occurs at region 2. The initial switching threshold ($V_t$) is in the order of 3.25 V and 3.75 V for the low and highly doped Si cases respectively.

The programming (compliance) current limit ($I_{prog}$) in both cases was 50 μA and the current through the devices remains at this value in regions 3 and 4, indicating that the memory cells are in their low resistance state. The actual value of $R_{on}$ is masked by the current limit circuitry in the semiconductor parameter analyzer, which manifests itself as the rising R-V curves at higher voltage in the inset. However, the lowest $R_{on}$ values observed were around 10 kΩ and 50 kΩ for the heavy and light doped Si cases respectively, more than four orders of magnitude lower than $R_{off}$.

During the ERASE sweep, illustrated in FIG. 34, the programmable structures, exhibit rectification action, which is shown in region 6. In the illustrated case, the highly-doped structure behaves like a reverse-biased Schottky diode and is erased at less than 5 Volts (about −4.75 V). The erase process for structure 3200 is generally higher that for a structure without an integrated diode, because the reversed-biased diode limits the current flow through the structure, until suitable voltage is applied to break down the diode, which allows current to flow in the reverse direction. Once the structure is erased, the diode is dissolved, and the structure behaves as a programmable structure with no diode, until conductive region 3212 is once again formed.

The reverse breakdown voltage for the low doped structure is thought to be over 100 V and the low doped structure exhibits a lower leakage current compared to structure 3200 with electrode 3204 having a higher doping level. The high break down voltage makes these low-doped devices very stable, but difficult to erase. Thus, the low doped structures may be particularly well suited for WORM applications.

Structure 3200 may been written, erased, and read in accordance with any of the techniques described above. For example, a write operation may be performed by applying a positive voltage across the first and second electrodes and an erase step may be performed by reversing the applied bias (i.e., applying a negative bias across the first and second electrodes), for a bipolar operation. Alternatively, the write and erase functions may be performed using the same (e.g., positive) voltage bias, for a unipolar operation. In this case, the erase may result from Joule heating and/or diffusion/ electromigration and the off state resistance may be lower compared to the off state resistance of a structure operated using the bipolar operation.

A programmable structure in accordance with the present invention may be used in many applications which would otherwise utilize traditional technologies such as WORM, EEPROM, FLASH or DRAM, and the like. Advantages provided by the present invention over present programmable structures include, among other things, lower production cost and the ability to use flexible fabrication techniques which are easily adaptable to a variety of applications. The programmable structures of the present invention are especially advantageous in applications where cost is the primary concern, such as smart cards and electronic inventory tags. Also, an ability to form the memory directly on a plastic card is a major advantage in these applications as this is generally not possible with other forms of semiconductor memories.

Further, in accordance with the programmable structures of the present invention, programmable structures may be scaled to less than a few square microns in size, the active portion of the device being less than one square micron. This provides a significant advantage over traditional semiconductor technologies in which each device and its associated interconnect can take up several tens of square microns.

Programmable structures and devices and system including the programmable structures described herein are advantageous because the programmable structures require relatively little internal voltage to perform write and erase functions, require relatively little current to perform the write and erase functions, are relatively fast (both write and read operations), require little to no refresh (even for "volatile" memory applications), can be formed in high-density arrays, are relatively inexpensive to manufacture, are robust and shock resistant, and do not require a monocrystalline starting material and can therefore be added to other electronic circuitry.

Although the present invention is set forth herein in the context of the appended drawing figures, it should be appreciated that the invention is not limited to the specific form shown. For example, while the programmable structure is conveniently described above in connection with programmable memory devices, the invention is not so limited; the structure of the present invention may additionally or alternatively be employed as programmable active or passive devices within a microelectronic circuit. Furthermore, although only some of the devices are illustrated as including buffer, barrier, or transistor components, any of these components may be added to the devices of the present invention. Various other modifications, variations, and enhancements in the design and arrangement of the method and apparatus set forth herein, may be made without departing from the spirit and scope of the present invention as set forth in the appended claims.

I claim:

1. A programmable structure, comprising:
   a first electrode comprising semiconductor material;
   an ion conductor formed of an ion conductive material and conductive ions proximate the first electrode; and
   a second electrode proximate the ion conductor,
   wherein the structure comprises a diode formed from a portion of the first electrode and a conductive region within the ion conductor and wherein the diode has a breakdown voltage of less than 5 volts.

2. The programmable structure of claim 1, wherein first electrode comprises doped silicon.

3. The programmable structure of claim 2, wherein doped silicon comprises doping at a level between about $10^{14}$ to about $10^{19}$.

4. The programmable structure of claim 1, further comprising an insulating layer wherein at least a portion of programmable structure is formed within a via in the insulating layer.

5. The programmable structure of claim 1, wherein the ion conductor comprises material selected from the group consisting of polymers, glasses, semiconductor, and chalcogenide materials $As_xS_{1-x}$—Ag, $As_xSe_{1-x}$—Ag, $As_xTe_{1-x}$—Ag, $Ge_xSe_{1-x}$—Ag, $Ge_xS_{1-x}$—Ag, $Ge_xTe_{1-x}$—Ag, $As_xS_{1-x}$—Cu, $As_xSe_{1-x}$—Cu, $As_xTe_{1-x}$—Cu, $Ge_xSe_{1-x}$—Cu, $Ge_xS_{1-x}$—Cu, $Ge_xTe_{1-x}$—Cu, $SiO_x$—Ag, $SiO_x$—Cu, $GeO_2$, $As_2O_3$, $Ag_2O$, $Cu_{(1,2)}O$, $GeO_2$, $As_2O_3$, $Ag_2O$, $Cu_{(1,2)}O$, $WO_x$, and $SiO_x$.

6. The programmable structure of claim 1, further comprising a barrier layer proximate the ion conductor.

7. The programmable structure of claim 1, wherein the programmable structure stores multiple bits of information.

8. The programmable structure of claim 1, wherein the second electrode is formed of a material selected from the group consisting of silver, copper, tungsten, nickel, molybdenum, platinum and metal silicides.

9. The programmable structure of claim 1, wherein the first electrode comprises doped polysilicon.

10. The programmable structure of claim 1, wherein the structure is configured for WORM applications.

11. The programmable structure of claim 1, wherein the structure is erased by applying a negative bias across the first electrode and the second electrode.

12. A programmable structure, comprising:
    a first electrode comprising semiconductor material;
    an ion conductor formed of an ion conductive material and conductive ions proximate the first electrode; and
    a second electrode proximate the ion conductor,
    wherein the structure comprises a diode formed from a portion of the first electrode and a conductive region within the ion conductor and wherein the diode has a breakdown voltage of more than 10 volts.

13. The programmable structure of claim 12, wherein first electrode comprises doped silicon.

14. The programmable structure of claim 13, wherein doped silicon comprises doping at a level between about $10^{14}$ to about $10^{19}$.

15. The programmable structure of claim 12, further comprising an insulating layer wherein at least a portion of programmable structure is formed within a via in the insulating layer.

16. The programmable structure of claim 12, wherein the ion conductor comprises material selected from the group consisting of polymers, glasses, semiconductor, and chalcogenide materials $As_xS_{1-x}$—Ag, $As_xSe_{1-x}$—Ag, $As_xTe_{1-x}$—Ag, $Ge_xSe_{1-x}$—Ag, $Ge_xS_{1-x}$—Ag, $Ge_xTe_{1-x}$—Ag, $As_xS_{1-x}$—Cu, $As_xSe_{1-x}$—Cu, $As_xTe_{1-x}$—Cu, $Ge_xSe_{1-x}$—Cu, $Ge_xS_{1-x}$—Cu, $Ge_xTe_{1-x}$—Cu, $SiO_x$—Ag, $SiO_x$—Cu, $GeO_2$, $As_2O_3$, $Ag_2O$, $Cu_{(1,2)}O$, $GeO_2$, $As_2O_3$, $Ag_2O$, $Cu_{(1,2)}O$, $WO_x$, and $SiO_x$.

17. The programmable structure of claim 12, further comprising a barrier layer proximate the ion conductor.

18. The programmable structure of claim 12, wherein the programmable structure stores multiple bits of information.

19. The programmable structure of claim 12, wherein the second electrode is formed of a material selected from the group consisting of silver, copper, tungsten, nickel, molybdenum, platinum and metal silicides.

20. The programmable structure of claim 12, wherein the first electrode comprises doped polysilicon.

* * * * *